United States Patent
Son et al.

(10) Patent No.: US 10,622,624 B2
(45) Date of Patent: Apr. 14, 2020

(54) POROUS SILICON COMPOSITE CLUSTER AND CARBON COMPOSITE THEREOF, AND ELECTRODE, LITHIUM BATTERY, FIELD EMISSION DEVICE, BIOSENSOR AND SEMICONDUCTOR DEVICE EACH INCLUDING THE SAME

(71) Applicants: Samsung Electronics Co., Ltd., Suwon-si, Gyeonggi-do (KR); Samsung SDI Co., Ltd., Yongin-si, Gyeonggi-do (KR)

(72) Inventors: Inhyuk Son, Yongin-si (KR); Jumyeung Lee, Suwon-si (KR); Seongyong Park, Hanam-si (KR); Jungho Lee, Yongin-si (KR); Sungsoo Han, Hwaseong-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 207 days.

(21) Appl. No.: 15/708,255

(22) Filed: Sep. 19, 2017

(65) Prior Publication Data
US 2018/0083272 A1   Mar. 22, 2018

(30) Foreign Application Priority Data

Sep. 19, 2016 (KR) .......... 10-2016-0119557
Aug. 30, 2017 (KR) .......... 10-2017-0110342
Sep. 15, 2017 (KR) .......... 10-2017-0118846

(51) Int. Cl.
H01M 4/36 (2006.01)
H01M 4/587 (2010.01)
(Continued)

(52) U.S. Cl.
CPC ............ *H01M 4/366* (2013.01); *H01L 35/22* (2013.01); *H01L 35/32* (2013.01); *H01M 4/131* (2013.01);
(Continued)

(58) Field of Classification Search
CPC ...... H01M 4/366; H01M 4/587; H01M 4/386; H01M 10/0427; H01M 4/483;
(Continued)

(56) References Cited

U.S. PATENT DOCUMENTS 6,911,767 B2   6/2005 Takai
6,976,897 B2   12/2005 Choi et al.
(Continued)

FOREIGN PATENT DOCUMENTS

CN    104934573 A    9/2015
JP    2011233497 A   11/2011
(Continued)

*Primary Examiner* — Daniel C. McCracken
(74) *Attorney, Agent, or Firm* — Cantor Colburn LLP

(57) ABSTRACT

A porous silicon composite cluster comprising: a porous core comprising a porous silicon composite secondary particle, wherein the silicon composite secondary particle comprises an aggregate of two or more silicon composite primary particles, and the silicon composite primary particles each comprise silicon, a silicon oxide of the Formula $SiO_x$, wherein $0<x<2$, disposed on the silicon, and a first graphene disposed on the silicon oxide; and a shell disposed on and surrounding the core, the shell comprising a second graphene.

38 Claims, 32 Drawing Sheets

(51) Int. Cl.
*H01M 4/38* (2006.01)
*H01M 10/04* (2006.01)
*H01L 35/22* (2006.01)
*H01L 35/32* (2006.01)
*H01M 4/48* (2010.01)
*H01M 4/62* (2006.01)
*H01M 4/485* (2010.01)
*H01M 4/131* (2010.01)
*H01M 4/133* (2010.01)
*H01M 10/0525* (2010.01)
*H01M 4/02* (2006.01)

(52) U.S. Cl.
CPC ............ *H01M 4/133* (2013.01); *H01M 4/364* (2013.01); *H01M 4/386* (2013.01); *H01M 4/483* (2013.01); *H01M 4/485* (2013.01); *H01M 4/587* (2013.01); *H01M 4/625* (2013.01); *H01M 10/0427* (2013.01); *H01M 10/0525* (2013.01); *H01M 2004/027* (2013.01)

(58) Field of Classification Search
CPC ....... H01M 10/0525; H01M 2004/027; H01M 4/131; H01M 4/133; H01M 4/364; H01M 4/485; H01M 4/625; H01M 4/1395; H01M 4/628; H01L 35/22; H01L 35/32; C01B 33/02; C01B 33/113; C01P 2004/80

See application file for complete search history.

(56) References Cited

U.S. PATENT DOCUMENTS

| | | | |
|---|---|---|---|
| 7,009,331 B2 | 3/2006 | Sheu et al. | |
| 7,816,031 B2 | 10/2010 | Cui et al. | |
| 8,241,793 B2 | 8/2012 | Zhamu et al. | |
| 8,753,545 B2 | 6/2014 | Obrovac et al. | |
| 8,999,583 B2 | 4/2015 | Hirose et al. | |
| 9,536,735 B2 | 1/2017 | Son et al. | |
| 9,595,711 B2 | 3/2017 | Son et al. | |
| 9,748,561 B2 | 8/2017 | Son et al. | |
| 9,917,298 B2 | 3/2018 | Son et al. | |
| 9,959,947 B2 | 5/2018 | Son et al. | |
| 2006/0066217 A1 | 3/2006 | Son | |
| 2010/0273058 A1 | 10/2010 | Lee et al. | |
| 2010/0288077 A1 | 11/2010 | Le | |
| 2012/0121977 A1 | 5/2012 | Xu et al. | |
| 2013/0130115 A1 | 5/2013 | Park et al. | |
| 2014/0087255 A1 | 3/2014 | Kim et al. | |
| 2014/0255785 A1* | 9/2014 | Do ........................ | C09D 1/00 429/231.8 |
| 2015/0093648 A1* | 4/2015 | Son ........................ | H01B 1/04 429/231.8 |
| 2015/0147649 A1 | 5/2015 | Jung et al. | |
| 2015/0243969 A1 | 8/2015 | Ku et al. | |
| 2015/0380728 A1* | 12/2015 | Son ........................ | H01M 4/364 252/502 |
| 2016/0093879 A1 | 3/2016 | Song et al. | |

FOREIGN PATENT DOCUMENTS

| | | |
|---|---|---|
| KR | 1020130033733 A | 4/2013 |
| KR | 1020140111548 A | 9/2014 |
| KR | 1020150045337 A | 4/2015 |
| KR | 1020150128432 A | 11/2015 |
| KR | 1020150141473 A | 12/2015 |
| KR | 1020160033638 A | 3/2016 |
| KR | 101634288 B1 | 6/2016 |
| KR | 1020170025419 A | 3/2017 |

\* cited by examiner

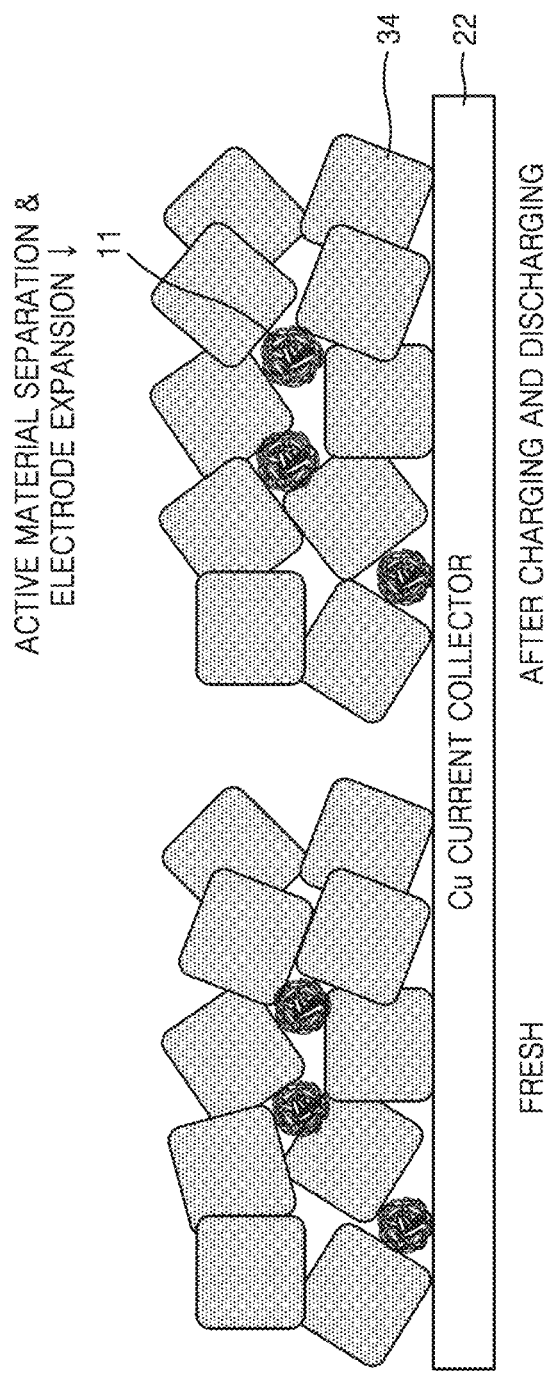

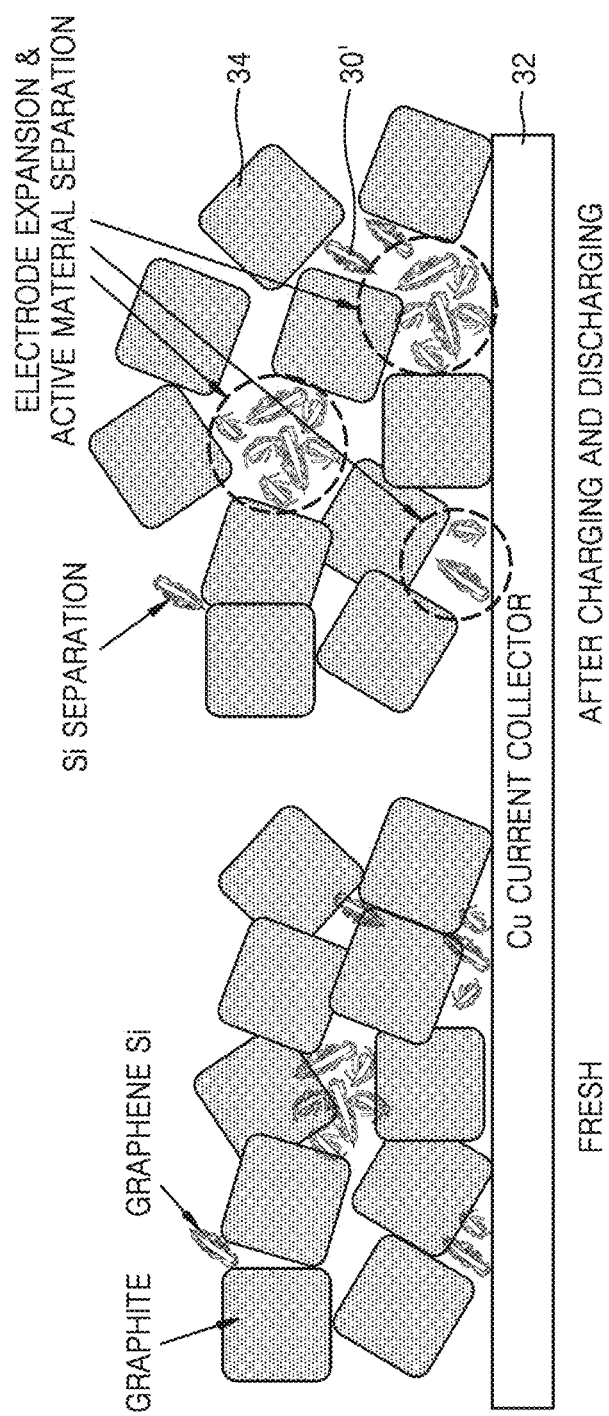

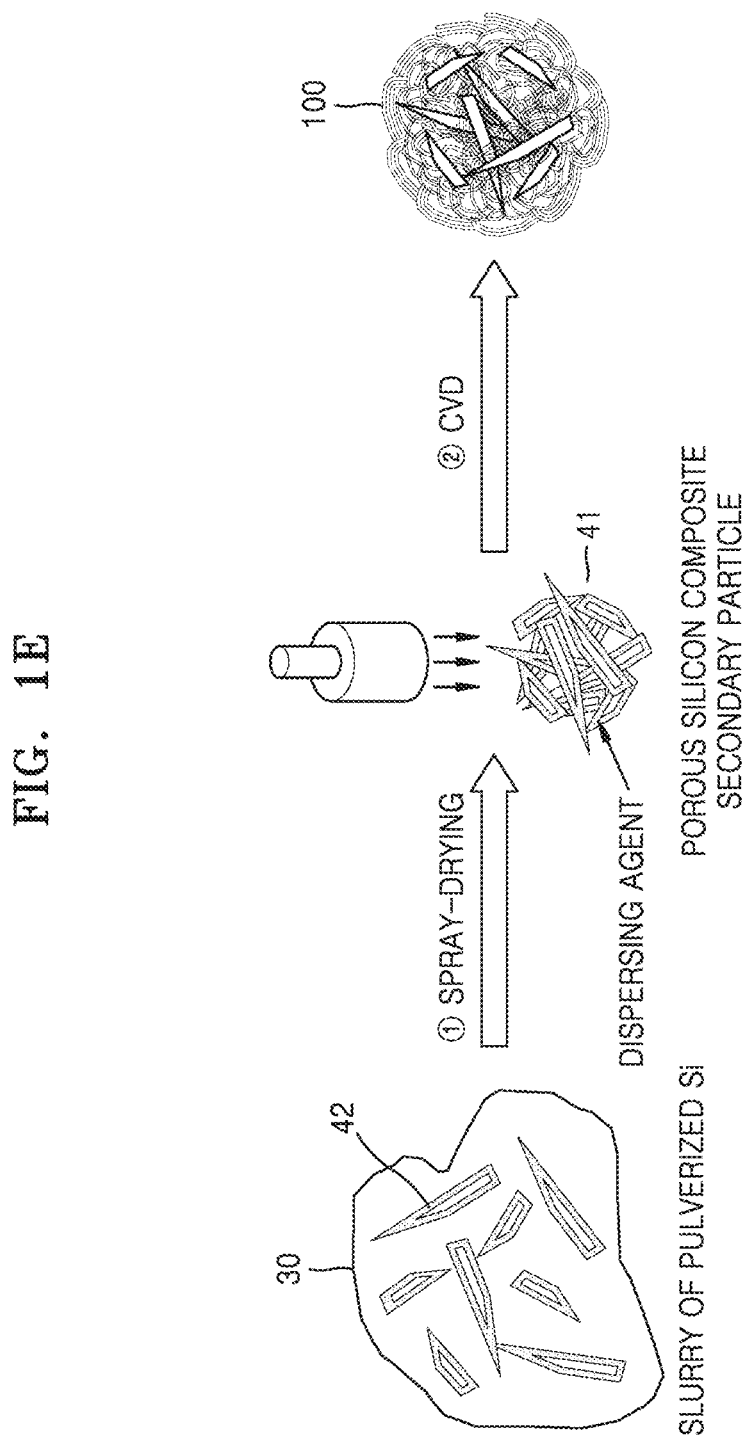

POROUS SILICON COMPOSITE CLUSTER AND CARBON COMPOSITE THEREOF, AND ELECTRODE, LITHIUM BATTERY, FIELD EMISSION DEVICE, BIOSENSOR AND SEMICONDUCTOR DEVICE EACH INCLUDING THE SAME

CROSS-REFERENCE TO RELATED APPLICATIONS

This application claims priority to and the benefit of Korean Patent Application No. 10-2016-0119557 filed on Sep. 19, 2016, Korean Patent Application No. 10-2017-0110342 filed on Aug. 30, 2017, and Korean Patent Application No. 10-2017-0118846 filed on Sep. 15, 2017, in the Korean Intellectual Property Office, and all the benefits accruing therefrom under 35 U.S.C. § 119, the contents of which are incorporated herein in their entirety by reference.

BACKGROUND

1. Field

The present disclosure relates to a porous silicon composite cluster, a carbon composite including the porous silicon composite cluster, and an electrode, a lithium battery, a field emission device, a biosensor, a semiconductor device, and a thermoelectric device, each including the porous silicon composite cluster.

2. Description of the Related Art

Silicon has been studied for use as a negative electrode material for lithium ion batteries because silicon has a high theoretical capacity of 4,200 milliampere hours per gram (mAh/g) and a low cost. However, silicon may undergo a large volume expansion as a $Li_{44}Si$ alloy is generated during discharge of a battery, and the volume expansion is understood to produce an electrically isolated active material in the electrode. Furthermore, an increase in the specific surface area of the active material may accelerate an electrolyte decomposition reaction. Thus, there remains a need for improved negative electrode materials.

SUMMARY

Provided is a porous silicon composite cluster.

Provided is a carbon composite including the porous silicon composite cluster and a carbonaceous material.

Provided is a lithium battery including an electrode that includes the porous silicon composite cluster or that includes a carbon composite including the porous silicon composite cluster and a carbonaceous material.

Provided is a field emission device including the porous silicon composite cluster or including a carbon composite including the porous silicon composite cluster and a carbonaceous material.

Provided is a biosensor including the porous silicon composite cluster or including a carbon composite including the porous silicon composite cluster and a carbonaceous material.

Provided is a semiconductor device including the porous silicon composite cluster or including a carbon composite including the porous silicon composite cluster and a carbonaceous material.

Provided is a thermoelectric device including the porous silicon composite cluster or including a carbon composite including the porous silicon composite cluster or a carbonaceous material.

According to an aspect, a porous silicon composite cluster includes a porous core including a porous silicon composite secondary particle, wherein the silicon composite secondary particle includes an aggregate of two or more silicon composite primary particles, and the silicon composite primary particles each include silicon, a silicon oxide of the Formula $SiO_x$, wherein $0<x<2$, disposed on the silicon, and a first graphene disposed on the silicon oxide; and a shell disposed on and surrounding the core, the shell including a second graphene.

According to another aspect, a method of preparing a porous silicon composite cluster includes: contacting silicon having silicon oxide disposed on the silicon, a dispersing agent, and a solvent to form a composition comprising a porous silicon secondary particle; and thermally treating the porous silicon secondary particle in an atmosphere comprising a carbon source gas to form the porous silicon composite cluster.

According to another aspect, a carbon composite includes the porous silicon composite cluster and a carbonaceous material.

According to another aspect, an electrode includes the porous silicon composite cluster or includes the porous silicon composite cluster and a carbonaceous material.

According to another aspect, a lithium battery includes the electrode.

According to another aspect, a field emission device includes the porous silicon composite cluster, or includes the porous silicon composite cluster and a carbonaceous material.

According to another aspect, a biosensor includes the porous silicon composite cluster, or includes the porous silicon composite cluster and a carbonaceous material.

According to another aspect, a semiconductor device includes the porous silicon composite cluster, or includes the porous silicon composite cluster and a carbonaceous material.

According to another aspect, a thermoelectric device includes the porous silicon composite cluster, or includes the porous silicon composite cluster and a carbonaceous material.

According to another aspect, a porous silicon composite cluster includes a porous core including a porous silicon composite secondary particle, wherein the porous silicon composite secondary particle includes an aggregate of two or more silicon composite primary particles, and the silicon composite primary particles each include at least one silicon oxide and a first graphene disposed on the at least one silicon oxide, wherein the at least one silicon oxide includes a silicon oxide of the Formula $SiO_x$, wherein $0<x<2$, a thermal treatment product of a silicon oxide of the Formula $SiO_x$, wherein $0<x<2$, or a combination including at least one of the foregoing; and a shell disposed on and surrounding the core, the shell including a second graphene.

Additional aspects will be set forth in part in the description which follows and, in part, will be apparent from the description, or may be learned by practice of the presented exemplary embodiments.

BRIEF DESCRIPTION OF THE DRAWINGS

These and/or other aspects will become apparent and more readily appreciated from the following description of exemplary embodiments, taken in conjunction with the accompanying drawings in which:

FIG. 1B is a diagram for illustrating the principle of operation of an embodiment of a negative electrode including a porous silicon composite cluster;

FIG. 1D is an exploded view that illustrates a state of a negative electrode including the graphene-grown silicon primary particles of FIG. 1C before and after charging and discharging;

FIG. 1E is a diagram illustrating an embodiment of a method of preparing a porous silicon composite cluster;

DETAILED DESCRIPTION

Figure 1A:
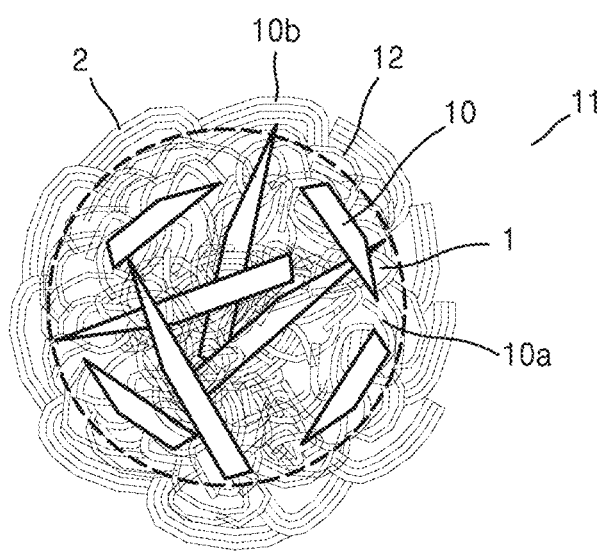
FIG. 1A is a schematic view that illustrates a structure of an embodiment of a porous silicon composite cluster.

Reference will now be made in detail to embodiments of a porous silicon composite cluster, an electrode including an electrode active material containing the porous silicon composite cluster, and a lithium battery, a field emission device, a biosensor, and a semiconductor device each including the porous silicon composite cluster, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms, unless otherwise indicated. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The inventors of the present disclosure have found that a negative electrode with improved durability against charging and discharging may be obtained by using a porous silicon composite cluster having a double core/shell structure, which may form a uniform charging and discharging network that suppresses disintegration caused by the volume expansion and contraction of silicon during charging and discharging, and which may ensure formation of a stable solid electrolyte interphase (SEI) layer on the surface of the porous silicon composite cluster.

According to an aspect, a porous silicon composite cluster includes a porous core including a porous silicon composite secondary particle, wherein the silicon composite secondary particle includes an aggregate of two or more silicon composite primary particles, and the silicon composite primary particles each include silicon, a silicon oxide of the Formula $SiO_x$, wherein $0<x<2$, disposed on the silicon, and a first graphene disposed on the silicon oxide; and a shell disposed on and surrounding the core, the shell including a second graphene.

As used herein, the term "cluster" means an aggregate of at least two or more primary particles, and may be construed as having substantially the same meaning as "secondary particle."

As used herein, the term "composite cluster" means a secondary particle including a shell disposed on and surrounding the secondary particle.

As used herein, the term "graphene" means a polycyclic aromatic molecule comprising a plurality of carbon atoms covalently bonded to one another, and the covalently bonded plurality of carbon atoms form a 6-membered ring as a basic repeating unit, but a 5-membered ring and/or a 7-membered ring may be included in the graphene. Accordingly, the graphene may appear as a single layer of the covalently bonded carbon atoms (in general, having a $sp^2$ bond). The graphene may include a single layer of carbon or multiple layers of carbon stacked upon one another, for example, one layer to about 100 layers, about 2 layers to about 100 layers, or about 3 layers to about 50 layers. The graphene may have a structure of flakes, nanosheets, or a layer (or film), wherein "nanosheets" means an irregular structure of graphene on the silicon oxide, and "layer" means a continuous, uniform film of graphene on the silicon oxide. As such, the graphene may have a structure of layers or a structure without distinct layers.

In an embodiment, the core of the porous silicon composite cluster may have a size of about 3 micrometers (μm) to about 10 μm, and the shell may have a thickness of about 10 nanometers (nm) to about 5,000 nm. For example, the thickness of the shell may be about 10 nm to about 1,000 nm. The size means either the diameter or the length of the major axis.

FIG. 1A illustrates a porous silicon composite cluster 11 according to an embodiment.

Referring to FIG. 1A, the porous silicon composite cluster 11 includes a core 1 including a porous silicon composite secondary particle 12 and a shell 2 disposed on the core 1, the shell 2 including a second graphene 10b.

The porous silicon composite secondary particle 12 may include an aggregate of two or more silicon composite primary particles 10 including silicon, a silicon oxide ($SiO_x$, where $0<x<2$) layer disposed on the silicon, and a first graphene 10a disposed on, for example disposed on at least a portion of, the silicon oxide of each of the silicon composite primary particles 10. In the silicon composite primary particles 10, the first graphene 10a may form a shell on the structure of the silicon oxide, and, in the core 1 including the porous silicon composite secondary particle 12, the second graphene 10b forms a shell on the core 1 to form the porous silicon composite cluster 11 having a double core/shell structure. Such a double core/shell structure may have a suppressed volume expansion of the silicon primary particles and inhibit side reactions that may occur with an electrolyte.

The number of graphene layers included in the first graphene 10a of the core 1 may be the same as or different from the number of layers included in the second graphene 10b of the shell 2.

In an embodiment, the second graphene 10b of the shell 2 may have a higher density than the density of the first graphene 10a of the core 1. In another embodiment, the number of graphene layers in the core 1 may be an integer of about 1 to about 30, and in still another embodiment, about 5 to about 15, and in yet another embodiment, about 10. The number of layers of the second graphene 10b in the shell 2 may be an integer of about 1 to about 50, and in an embodiment, about 20 to about 30.

In an embodiment, the porous silicon composite cluster 11 may further include an outer layer having a greater density than the density of the core 1. The outer layer may have a thickness of about 20 nanometers (nm) to about 60 nm. However, embodiments are not limited thereto.

The ratio of the diameter of the porous silicon composite secondary particle 12 to the diameter of the porous silicon composite cluster 11 may be about 1:1 to about 1:30, and in another embodiment, about 1:1 to about 1:25, and in still another embodiment, about 1:3 to about 1:25, or about 1:5 to about 1:25, or about 1:10 to about 1:25, or about 1:15 to about 1:25, or about 1:21. The ratio of the diameter of the porous silicon composite secondary particle 12 and the porous silicon composite cluster 11 may correspond to a diameter ratio when the porous silicon composite secondary particle 12 and the porous silicon composite cluster 11 both have spherical shapes. When the porous silicon composite secondary particle 12 and the porous silicon composite cluster 11 are both non-spherical, the diameter ratio means a major axis length ratio.

In another embodiment, the porous silicon composite cluster 11 may have a core diameter of about 3 micrometers (μm) to about 10 μm, for example, about 5 μm to about 10 μm, or about 3 μm to about 8 μm, and a shell thickness of about 10 nanometers (nm) to about 5,000 nm (i.e., about 0.01 μm to about 5 μm), for example, about 10 nm to about 1,000 nm, or about 10 nm to about 500 nm, or about 10 nm to about 250 nm. The ratio of the diameter of the core 1 to the thickness of the shell 2 (e.g., a carbon coating film) of the porous silicon composite cluster 11 may be from about 1:0.001 to about 1:1.67, and may be, for example, about 1:0.001 to 1:0.5, or about 1:0.0033 to about 1:1.67, or about 1:0.001 to about 1:0.0033, or about 1:0.0033 to about 1:0.5, or about 1:0.001, or about 1:1.67, or about 1:0.0033, or about 1:0.5.

The total amount of the first graphene and the second graphene in the porous silicon composite cluster may be about 0.1 parts to about 2,000 parts by weight, and in an embodiment, about 0.1 parts to about 300 parts by weight, and in another embodiment, about 0.1 parts to about 90 parts by weight, and in still another embodiment, about 5 parts to about 30 parts by weight, based on 100 parts by weight of the silicon. When the total amount of the first graphene and the second graphene is within these ranges, volume expansion of the silicon may be effectively suppressed, and improved conductivity may be obtained.

The first graphene may extend from the silicon oxide ($SiO_x$, where $0<x<2$) by a distance of about 10 nm or less, for example, about 0.5 nm to about 10 nm, or about 1 nm to about 10 nm, or about 5 nm to about 10 nm. In an embodiment, the first graphene may extend from the silicon oxide by a distance about 1 nm or less, for example, about 0.1 nm to about 1 nm, or about 0.5 nm to about 1 nm, and may include at least 1 to about 30 graphene layers, for example, about 1 to about 20 graphene layers, or about 1 to about 10 graphene layers, and may have a total thickness (i.e., the total thickness of the layers) of about 0.3 nm to about 1,000 nm, for example, about 0.3 to about 500 nm, or about 0.5 to about 100 nm, or about 0.6 nm to about 12 nm. The first graphene may be oriented at an angle of about 0° to about 90° with respect to a major axis of the silicon.

The second graphene may extend from the silicon oxide ($SiO_x$, where $0<x<2$) by a distance of about 1,000 nm or less, for example, about 500 nm or less, and in an embodiment, about 10 nm or less, and in an embodiment, about 1 nm or less, and in another embodiment, about 0.00001 nm to about 1 nm, and may include at least 1 to about 30 graphene layers, for example, about 1 to about 20 graphene layers, or about 1 to about 10 graphene layers, and may have a total thickness of about 0.6 nm to about 50 nm, and in an embodiment, about 1 nm to about 50 nm. The graphene may be oriented at an angle of about 0° to about 90° with respect to a major axis of the silicon.

A thickness of the silicon oxide ($SiO_x$, wherein $0<x<2$) disposed on the silicon may affect a shape and/or a structure of the graphene. The silicon oxide ($SiO_x$, where $0<x<2$) may have a thickness of about 300 μm or less, for example about 30 μm or less, or for example, about 10 nm or less. In an embodiment, the silicon oxide ($SiO_x$, wherein $0<x<2$) in the porous silicon composite cluster for use in a battery may have a thickness of about 10 nm or less, and in another embodiment, about 0.1 nm to about 10 nm, and in still another embodiment, about 0.1 nm to about 5 nm, for example, about 0.5 nm to about 5 nm. When the thickness of the silicon oxide ($SiO_x$, wherein $0<x<2$) is within these ranges, a battery manufactured using the porous silicon composite cluster including the silicon oxide ($SiO_x$, wherein $0<x<2$) disposed on the silicon may have an improved charge/discharge capacity.

The silicon is not limited to having any specific form, and may be in the form of, for example, spheres, nanowires, needles, rods, particles, nanotubes, nanorods, a wafer, nanoribbons, or a combination comprising at least one of the foregoing. The silicon may have an average diameter of about 10 nm to about 40 μm, for example, about 10 nm to about 30 μm, or about 10 nm to about 1000 nm, or about 10 nm to about 500 nm, or about 10 nm to about 250 nm, or for example, about 100 nm.

In an embodiment, the silicon oxide ($SiO_x$, wherein $0<x<2$) may be disposed, for example formed, on needle-like silicon, and the first graphene may be disposed, for example formed, on the silicon oxide ($SiO_x$, wherein $0<x<2$). For example, the needle-like silicon may have a length of about 100 nm to about 160 nm, and in another embodiment, or about 100 nm to about 140 nm, or about 108 nm to about 125 nm; and may have a thickness of about 10 nm to about 100 nm, and in still another embodiment, about 20 nm to about 50 nm, and in yet another embodiment, about 40 nm.

In an embodiment, the silicon oxide ($SiO_x$, wherein $0<x<2$) may be disposed, for example formed, on silicon nanoparticles, and the first graphene may be disposed, for example formed, on the silicon oxide ($SiO_x$, wherein 0<x<2). The silicon nanoparticles may have an average particle diameter of about 40 nm to about 40 µm, for example, about 40 nm to about 1000 nm, or about 40 nm to about 100 nm.

When the silicon has a form of a wafer, the silicon wafer may have a thickness of about 2 µm or less, for example, about 0.001 µm to about 2 µm.

The porous silicon composite secondary particle may have an average particle diameter (D50) of about 200 nm to about 50 µm, and in an embodiment, about 1 µm to about 30 µm, and in another embodiment, about 1 µm to about 10 µm, and in still another embodiment, about 3 µm to about 5 µm. The porous silicon composite secondary particle may have a specific surface area of about 0.1 square meters per gram ($m^2/g$) to about 100 $m^2/g$, and in an embodiment, about 1 $m^2/g$ to about 30 $m^2/g$. The porous silicon composite secondary particle may have a density of about 0.1 grams per cubic centimeter (g/cc) to about 2.8 g/cc, for example, 0.1 g/cc to about 2.57 g/cc, or about 0.5 g/cc to about 2 g/cc.

The porous silicon composite cluster may have a narrow particle size distribution. For example, the porous silicon composite cluster may have a D50 particle size of about 1 µm to about 30 µm, a D10 particle size of about 0.001 µm to about 10 µm, and a D90 particle size of about 10 µm to about 30 µm.

The porous silicon composite cluster according to an embodiment may have a narrow particle size distribution within these ranges. Unlike the porous silicon composite cluster according to an embodiment, silicon composite secondary particles that can be obtained from silicon composite primary particles may have an irregular secondary particle size distribution, and thus it may be difficult to control the particle size distribution of the negative active material so as to improve the cell performance.

The amount of oxygen in the porous silicon composite cluster may be about 0.01 atom percent (atom %) to about 15 atom %, and in an embodiment, about 3.5 atom % to about 5 atom %, and in another embodiment, about 3.5 atom % to about 3.8 atom %, based on the total atom percent of oxygen, carbon and silicon atoms in the porous silicon composite cluster. Without being bound by theory, the small amount of oxygen in the porous silicon composite cluster, as compared with that of silicon-based materials, is attributed to the suppressed oxidation of silicon due to the use a dispersing agent, for example stearic acid, in preparing the porous silicon composite cluster. Such a reduced amount of oxygen in the porous silicon composite cluster may improve silicon capacity and initial efficiency.

Figure 1C:
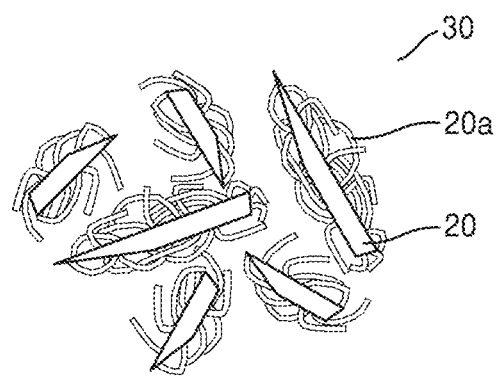
FIG. 1C is a schematic view that illustrates a structure of a graphene-grown silicon primary particle.

FIG. 1C illustrates graphene-grown silicon primary particles 30, and FIG. 1D illustrates a state of a negative electrode including the graphene-grown silicon primary particles 30' after charging and discharging.

The graphene-grown silicon primary particles 30 including graphene directly grown on silicon particles have a structure including a first graphene 20a on needle-like silicon particles 20. A negative electrode may be manufactured by forming a negative active material layer including a mixture of the graphene-grown silicon primary particles 30 and graphite 34 on a copper current collector 32.

However, as illustrated in FIG. 1D, after charging and discharging of the negative electrode, due to the volume expansion and contraction of silicon, the graphene-grown silicon primary particles 30' acting as an active material may become separated and consequential isolation of the silicon may occur, leading to reduced capacity. Furthermore, continuous growth of a solid electrolyte interphase (SEI) layer on the surface of the silicon primary particles 30' may occur, leading to increased lithium consumption and reduced durability against charging and discharging.

Hereinafter, the operation principle of a negative electrode using a negative active material layer including a porous silicon composite cluster 11 according to an embodiment and graphite 24 will now be described with reference to FIG. 1B.

Referring to FIG. 1B, a negative active material layer is arranged on a copper (Cu) current collector 22 as a negative electrode current collector, wherein the negative active layer may include a mixture of the porous silicon composite cluster 11, as graphene-grown silicon particles, and graphite 34. The porous silicon composite cluster 11 may have a small Brunauer-Emmett-Teller (BET) specific surface area to prevent permeation of an electrolyte, and a reduced area in which a side reaction with the electrolyte could occur, and thus may effectively suppress side reactions with the electrolyte, separation of the active material, and expansion of the electrode. As a result, a lithium battery using an electrode containing the porous silicon composite cluster 11 may have improved initial efficiency and durability against charging and discharging. The silicon composite primary particles in the porous silicon composite cluster 11 are interconnected via graphene, forming a stable sliding network, and consequently improving the suppression of volume expansion.

Graphene may suppress disintegration or pulverization of the silicon composite primary particles which occurs in graphene-grown silicon primary particles. Graphene sliding layers may serve as a clamping layer which reduces, for example prevents, disintegration of the silicon composite primary particles, while also allowing for an alloying reaction of lithium ions with silicon (Si) to yield a significant specific capacity and provide a substantially continuous conduction pathway between the particles.

The graphene layers may slide over one another while the silicon composite primary particles swell, and then slide back to their relaxed positions during delithiation. This movement is because the van der Waals force is greater than the force of friction between the layers.

The clamping effect of the graphene layers serving as a clamping layer which prevents disintegration of the silicon composite primary particles may be confirmed by evaluating whether the graphene layers remain the same after repeated lithiation/delithiation cycles (e.g., 200 cycles).

In an embodiment, the porous silicon composite cluster may have an improved volumetric capacity, for example, a volumetric capacity of about 600 milliampere hours per cubic centimeter (mAh/cc) to about 2,000 mAh/cc.

According to another embodiment, a porous silicon composite cluster includes a porous core including a porous silicon composite secondary particle, wherein the porous silicon composite secondary particle includes an aggregate of two or more silicon composite primary particles, and the silicon composite primary particles each include at least one silicon oxide and a first graphene disposed on the at least one silicon oxide, wherein the at least one silicon oxide includes a silicon oxide of the Formula $SiO_x$, wherein 0<x<2, a thermal treatment product of a silicon oxide of the Formula $SiO_x$, wherein 0<x<2, or a combination including at least one of the foregoing; and a shell disposed on and surrounding the core, the shell including a second graphene.

As used herein, the term "thermal treatment product of a silicon oxide of the Formula $SiO_x$ (wherein 0<x<2)" means a product obtained by thermally treating the silicon oxide of the Formula $SiO_x$ (wherein 0<x<2). The thermal treatment may be a thermal treatment for growing graphene on the silicon oxide of the Formula $SiO_x$ (wherein $0<x<2$) through a vapor deposition reaction. In the vapor deposition reaction, a carbon source gas or a gas mixture including a carbon source gas and a reducing gas may be used as a graphene source. For example, the reducing gas may be hydrogen.

In an embodiment, the thermal treatment product of the silicon oxide of the Formula $SiO_x$, wherein $0<x<2$ may be a product obtained by thermally treating the silicon oxide of the Formula $SiO_x$, wherein $0<x<2$, in an atmosphere of i) a carbon source gas or ii) a gas mixture including a carbon source gas and a reducing gas.

In another embodiment, the thermal treatment product of the silicon oxide of the Formula $SiO_x$, wherein $0<x<2$ may have, for example, a structure including silicon (Si) arranged in a matrix of a silicon oxide of the Formula $SiO_y$, wherein $0<y\leq2$.

In still another embodiment, the thermal treatment product of the silicon oxide of the Formula $SiO_x$, wherein $0<x<2$ may have i) a structure including silicon (Si) arranged in a matrix of silicon oxide $SiO_2$, ii) a structure including silicon (Si) arranged in a matrix including silicon oxide $SiO_2$ and a silicon oxide of the Formula $SiO_y$, wherein $0<y<2$, or iii) a structure including silicon (Si) arranged in a matrix of a silicon oxide of the Formula $SiO_y$, wherein $0<y<2$.

In an embodiment, an amorphous carbon layer may be disposed or located between the at least one silicon oxide and the first graphene disposed on the at least one silicon oxide. In another embodiment, an amorphous carbon layer may be disposed or located between the porous core including the porous silicon composite secondary particle, and the second graphene. The amorphous carbon layer may serve as a graphene growing nucleus facilitating growing graphene on the silicon oxide and the porous core.

An embodiment of a method of preparing a porous silicon composite cluster (100) according to one of the above-described embodiments will now be described with reference to FIG. 1E.

First, a structure including silicon and a silicon oxide ($SiO_x$, wherein $0<x<2$) on the silicon may be disintegrated to obtain a disintegrated silicon primary particle 42. The disintegrated silicon primary particle 42 may be mixed with a dispersing agent and a solvent to thereby obtain a composition 40, as illustrated in FIG. 1E. Next, porous silicon composite secondary particle 41 may be prepared from the composition 40.

The porous silicon composite secondary particles 41 may have a porosity of, for example, about 0.1% to about 50%, and a pore size of, for example, about 10 nm to about 500 nm.

The preparing of the porous silicon composite secondary particle 41 from the composition 40 may be performed by any suitable method, for example, co-precipitation, spray drying, or a solid phase method. For example, the porous silicon composite secondary particle may be prepared by spray drying. When the porous silicon composite secondary particle 41 is prepared by spray drying, a particle diameter may be controlled by appropriately choosing a spraying type, a pressurized gas supply rate, a composition supply rate, a drying temperature, and the like. Similarly, when the porous silicon composite secondary particle 41 is prepared by a different suitable method, appropriate steps can also be used to control particle diameter.

In an embodiment, the spray drying may be performed at an atmospheric temperature of about room temperature (25° C.) to about 500° C., for example, about 50° C. to about 300° C. When the spray drying is performed within these temperature ranges, particle agglomeration, and blocking of a particle discharge outlet may be prevented, due to moisture condensation near the particle discharge outlet, and the porous silicon composite secondary particles may have appropriate porosity.

In the spray drying, a spraying pressure may be about 1 bar to about 5 bar.

In an embodiment, the spray drying may be performed using a dispersing agent. The dispersing agent may uniformly disperse the silicon primary particles. The dispersing agent may be, but is not limited to, stearic acid, resorcinol, polyvinyl alcohol, pitch, or a combination comprising at least one of the foregoing. The amount of the dispersing agent may be about 1 part to about 15 parts by weight, for example, about 5 parts to about 10 parts by weight, based on 100 parts of a total weight of the composition. When the amount of the dispersing agent is within these ranges, the silicon primary particles and first graphene may be uniformly dispersed without agglomerating.

A solvent may be further used. The solvent may be, for example, ethanol, methanol, isopropyl alcohol, or a combination comprising at least one of the foregoing. When these alcohol solvents are used, the dispersing agent may be removed, so that the amount of the dispersing agent remaining in the porous silicon composite cluster may be reduced. As a result, an amount of oxygen may be reduced in the porous silicon composite cluster and thus only a small amount of oxygen may remain.

Prior to the spray drying, a surface area of the silicon secondary particles 41 may be increased, for example, by pulverization. To this end, pulverized silicon secondary particles 41 may be used as the starting material.

For example, when formed by spray drying, the obtained porous silicon composite secondary particles 31 may be spherical. The dispersing agent, for example, stearic acid, may partially remain on a portion of a surface of the porous silicon composite secondary particles 31.

Next, as shown in FIG. 1E, while a carbon source gas is supplied to provide for carbon of the first graphene, the porous silicon composite secondary particle 31 may be thermally treated to thereby prepare the porous silicon composite cluster 100.

The carbon source gas may fill the pores in the porous silicon composite secondary particle and then carbon grows on surfaces of the porous silicon composite secondary particle. The silicon oxide ($SiO_x$, wherein $0<x<2$) is an unstable oxygen-deficient material as compared with silica ($SiO_2$), and tends to form a stable material by reacting with another reactive material, such as a carbon source gas. Based on this tendency, the silicon oxide ($SiO_x$, wherein $0<x<2$) may be used as a seed layer for forming graphene.

The carbon source gas may be a compound represented by Formula 1, a compound represented by Formula 2, a compound represented by Formula 2a, an oxygen-containing compound represented by Formula 3, or a combination comprising at least one of the foregoing.

$C_nH_{(2n+2-a)}[OH]_a$  Formula 1 wherein, in Formula 1, n is an integer of 1 to 20, and a is 0 or 1,

$C_nH_{(2n)}$  Formula 2 wherein, in Formula 2, n is an integer of 2 to 6,

$C_nH_n$  Formula 2a wherein, in Formula 2, n is an integer of 2 to 6, and

$C_xH_yO_z$  Formula 3 wherein, in Formula 3, x is an integer of 1 to 20, y is 0 or an integer of 1 to 20, and z is 1 or 2.

The carbon source gas may be, for example, methane, ethylene, propylene, methanol, ethanol, propanol, acetylene ($C_2H_2$), or a combination comprising at least one of the foregoing.

In an embodiment, the carbon source gas may be acetylene gas ($C_2H_2$).

In an embodiment, an inert gas, for example, nitrogen, helium, argon, or a combination comprising at least one of the foregoing, may be further added to the carbon source gas to provide a mixed gas.

In an embodiment, the carbon source gas may be provided as a mixed gas that further includes a second oxygen-containing compound represented by Formula 3a:

$$C_xH_yO_z \qquad \text{Formula 3a}$$

In Formula 3a, x may be 0 or an integer of 1 to 20, y may be 0 or an integer of 1 to 20, and z may be 1 or 2, and the second oxygen-containing compound represented by Formula 3a is different from the oxygen-containing compound represented by Formula 3. For example, in Formula 3a, x may be 0 and the second oxygen-containing compound may be water vapor ($H_2O$). The amount of water vapor in the gas mixture, though not specifically limited, may be, for example, in a range of about 0.01% by volume to about 10% by volume, based on 100% by volume of the carbon source gas. According to an embodiment, the morphology of the graphene may be varied depending on the type of the carbon source gas.

When the mixed gas includes water vapor, conductivity of the porous silicon composite cluster may further be improved. While not being limited to this theory, it is understood that since carbon having a high degree of crystallinity may be deposited, in the presence of water vapor, on the silicon coated with the silicon oxide by reaction with the gas mixture, the porous silicon composite cluster may have high conductivity even when coated with a small amount of carbon.

When the oxygen-containing compound is used as the carbon source gas, the silicon oxide layer may be formed on the silicon to have a larger thickness as compared with a thickness of a silicon oxide layer that is not formed in the presence of the oxygen-containing compound. The thickness of the silicon oxide may be as described above, and. when the thickness of the silicon oxide is within these ranges, a shape and a thickness of the graphene may be appropriately controlled. In an embodiment, when the silicon oxide has a thickness greater than the thickness of a silicon oxide layer that is formed without an oxygen-containing compound, the graphene layer on the silicon oxide may have a denser structure than a graphene nanosheet.

In an embodiment, the carbon source gas may be methane, a mixed gas of methane and an inert gas, an oxygen-containing gas, or a mixed gas of methane and an oxygen-containing gas. In another embodiment, the carbon source gas may be a mixed gas of $CH_4$ and $CO_2$, or a mixed gas of $CH_4$, $CO_2$, and $H_2O$, or a mixed gas of $CH_4$ and $N_2$.

The mixed gas of $CH_4$ and $CO_2$ may be supplied at a molar ratio (for example, $CH_4$:$CO_2$) of about 1:0.20 to about 1:0.50, and in an embodiment, at a molar ratio of about 1:0.25 to about 1:0.45, and in another embodiment, at a molar ratio of about 1:0.30 to about 1:0.40.

The mixed gas of $CH_4$, $CO_2$, and $H_2O$ may be supplied at a molar ratio (for example, $CH_4$: $CO_2$:$H_2O$) of about 1:0.20 to 0.50:0.01 to 1.45, and in an embodiment, at a molar ratio of about 1:0.25 to 0.45:0.10 to 1.35, and in another embodiment, at a molar ratio of about 1:0.30 to 0.40:0.50 to 1.0.

The mixed gas of $CH_4$ and $N_2$ may be supplied at a molar ratio (for example, $CH_4$:$N_2$), of about 1:0.20 to about 1:0.50, and in an embodiment, at a molar ratio of about 1:0.25 to 1:0.45, and in another embodiment, at a molar ratio of about 1:0.30 to about 1:0.40. In still another embodiment, the carbon source gas may not include an inert gas such as nitrogen.

The thermal treatment may be performed at a temperature of about 600° C. to about 1,100° C., and in an embodiment, about 750° C. to about 1,100° C., or about 700° C. to about 1,000° C., or about 800° C. to about 1,000° C. When the thermal treatment is performed within these temperature ranges, graphene may be generated at a high density in the core and the shell.

The thermal treatment may be performed at any suitable pressure level. The pressure level for the thermal treatment may be appropriately selected in consideration of a thermal treatment temperature, composition of the gas mixture, and target amount of coated carbon. The pressure level for the thermal treatment may be controlled by varying the amounts of inflow and outflow of the gas mixture. For example, the pressure for the thermal treatment may be about 1 atmosphere (atm) or greater, and in an embodiment, about 2 atm or greater, about 3 atm or greater, about 4 atm or greater, or about 5 atm or greater, although pressure levels are not limited thereto.

The thermal treatment time may not be specifically limited, and may be appropriately controlled depending on the thermal treatment temperature, thermal treatment pressure, composition of the gas mixture, and target amount of coated carbon. For example, the thermal treatment time may be in a range of about 10 minutes to about 100 hours, and in an embodiment, may be in a range of about 30 minutes to about 90 hours, and in another embodiment, may be in a range of about 50 minutes to about 40 hours, although thermal treatment times are not limited thereto. While not being limited to this theory, it is understood that the longer the thermal treatment time, the greater the amount of graphene (carbon) that may be deposited, and the better the electrical characteristics of the composite may become. However, these effects may not be directly proportional to the thermal treatment time. For example, deposition of graphene may stop or the deposition rate may become low after a predetermined duration.

According to an embodiment, a method of preparing a porous silicon composite cluster may provide a uniform coating of graphene on the silicon covered with the silicon oxide ($SiO_x$) layer, even at a relatively low temperature, through a vapor phase reaction of the carbon source gas. Separation of the graphene from the silicon oxide layer may substantially not occur. When the thickness of the silicon oxide is appropriately controlled, the separation of the graphene may be even further suppressed. In this regard, a thickness of the silicon oxide that may efficiently suppress separation of the graphene is as described above.

In an embodiment, the first and second graphene may be formed on the silicon oxide ($SiO_x$, wherein 0<x<2) that is coating the silicon by non-catalytic vapor carbon deposition.

The non-catalytic vapor carbon deposition may include thermally treating the silicon covered with the silicon oxide ($SiO_x$, wherein 0<x<2) under a gas atmosphere, the atmosphere including a compound represented by Formula 1, a compound represented by Formula 2, an oxygen-containing compound represented by Formula 3, or a combination comprising at least one of the foregoing.

The thickness of the silicon oxide ($SiO_x$, wherein $0<x<2$) layer may be selected by controlling a process involved in graphene formation, for example, by controlling the composition of the carbon source gas used to form the first and second graphene. While not wanting to be limited to this theory, it is understood that such coating by the above-described non-catalytic vapor carbon deposition is associated with reforming the silicon oxide ($SiO_x$, wherein $0<x<2$) disposed on the silicon by using, for example, $CO_2$ in the gas mixture.

According to the non-catalytic vapor carbon deposition method, graphene may be directly grown on the surface of the silicon oxide ($SiO_x$, wherein $0<x<2$) disposed on the silicon, and thus the silicon oxide ($SiO_x$, wherein $0<x<2$) and the second graphene may be strongly adhered to each other.

In an embodiment, when the silicon oxide ($SiO_x$, wherein $0<x<2$) is not present on the silicon, by a process of reaction with a carbon-containing mixed gas and an oxygen-containing mixed gas, a silicon oxide ($SiO_x$, wherein $0<x<2$) layer may be formed first on the silicon by reaction with the oxygen-containing mixed gas, and then the first and second graphene may be formed thereon by reaction with the carbon-containing mixed gas.

A degree of adhesion between the silicon oxide ($SiO_x$, wherein $0<x<2$) layer and the first and the second graphene may be evaluated by measuring a distance between them by using a scanning electron microscopy (SEM).

In an embodiment, the porous silicon composite cluster may further include a metal oxide or a metal fluoride. When the porous silicon composite cluster further includes a metal oxide or a metal fluoride, formation of a solid electrolyte interphase (SEI) layer may be prevented due to suppression of a side reaction.

The metal oxide or metal fluoride may include a magnesium oxide, a manganese oxide, an aluminum oxide, a titanium oxide, a zirconium oxide, a tantalum oxide, a tin oxide, a hafnium oxide, an aluminum fluoride ($AlF_3$), or a combination comprising at least one of the forgoing.

The graphene layers may slide over each other while the porous silicon composite secondary particles and silicon composite primary particles (i.e., primary and secondary particles; together "particles") swell during lithiation, and then slide back to their relaxed positions during delithiation. Without being bound by theory, this movement occurs because the van der Waals force is greater than the force of friction between the graphene layers. Thus, the graphene may serve as SEI-stabilizing clamping layers that minimize, for example prevent, disintegration of the particles, while allowing for an alloying reaction of lithium ions with silicon (Si) to yield a significant specific capacity and provide a continuous conduction pathway between the particles. The porous silicon composite cluster may have a large specific surface area, and the clamping may prevent a reduction in initial efficiency and volume energy density of a battery when used in the battery. The clamping effect of the graphene layers may be confirmed by SEM and evaluating whether the graphene layers remain substantially the same after about 200 repeated lithiation/delithiation cycles.

In an embodiment, the porous silicon composite cluster may include nanosized pores between closely compacted graphene layers on the silicon composite primary particles, the pores serving as a buffer during the volume expansion of the primary and secondary particles. An SEI layer may also be stably grown on the primary particles through thermal treatment. The graphene layers on the secondary particles may slide over one another, expanding their volume while the volume expansion and contraction of silicon occur, to prevent the primary particles from being exposed to the exterior of the secondary particle, and thus suppress contact of the silicon composite primary particles with the electrolyte.

According to another embodiment, a carbon composite is provided and includes a porous silicon composite cluster according to one of the above-described embodiments and a carbonaceous material. For example, the core and the shell may each further include a carbonaceous material. A porous silicon composite cluster according to an embodiment may have a reduced specific surface area and an increased volume density, as compared with silicon composite primary particles, and thus may improve volumetric energy density and further reduce volume expansion of an electrode when mixed with a carbonaceous material. The carbon composite may further have an improved initial efficiency, specific capacity characteristics, rate capability, and durability, as compared to when the porous silicon composite cluster is used without the carbonaceous material.

In an embodiment, carbonaceous material may be disposed on the porous silicon composite cluster as a carbon coating layer, for example as an outer layer. When the porous silicon composite cluster further including a carbon coating layer is used, a lithium battery may have improved lifetime characteristics, although initial efficiency may be reduced.

In an embodiment, the amount of the carbonaceous material may be about 0.001 parts to about 99 parts by weight, and in another embodiment, about 10 parts to about 97 parts by weight, and in still another embodiment, about 50 parts to about 97 parts by weight, based on 100 parts by weight of the carbon composite. When the amount of the carbonaceous material is within these ranges, a carbon composite with improved capacity and conductivity may be attained.

The carbonaceous material may include graphene, amorphous carbon, graphite, pitch, fullerene, carbon fiber, carbon nanotubes, or a combination comprising at least one of the foregoing.

In an embodiment, the carbon composite may include graphite, and the porous silicon composite cluster may be disposed on the graphite.

The graphite may be, for example, $SFG_6$ synthetic graphite, and may have an average particle diameter of about 6 μm. When an electrode is formed using the carbon composite, the amount of the carbon composite in the electrode may be, for example, from about 68 parts to about 87 parts by weight, and the amount of a binder may be, for example, from about 13 parts to about 32 parts by weight. In an embodiment, the amount of the graphite in the carbon composite may be, for example, 1 part to about 20 parts by weight, based on 100 parts by weight of the carbon composite.

The binder may be, for example, lithium polyacrylate (Li-PAA).

In an embodiment, the graphite is coated on the silicon through a vapor phase reaction to form a coating layer, and the coating layer may have a high degree of crystallinity. When the porous silicon composite cluster is used as a negative active material, the negative active material may have improved conductivity without a substantial structural change.

In an embodiment, the vapor carbon deposition reaction for preparing a porous silicon composite cluster according to an embodiment may be performed in an atmosphere of a gas mixture including a carbon source gas and a reducing gas such as hydrogen.

In another embodiment, when the silicon composite primary particles in a porous silicon composite cluster according an embodiment includes i) a silicon oxide of the Formula $SiO_x$, wherein $0<x<2$, ii) a thermal treatment product of a silicon oxide of the Formula $SiO_x$, wherein $0<x<2$, or iii) a combination thereof; and a first graphene disposed on the at least one silicon oxide, the first graphene may be obtained through thermal treatment, for example, in an atmosphere of a gas mixture including a carbon source gas such as methane and hydrogen. For example, a mixed ratio of the carbon source gas to hydrogen may be about 1:1 to 1:7, and in some embodiments, about 1:1 to 1:5 by mole or by flow rate.

A process of preparing a carbon composite using a porous silicon composite cluster according to an embodiment may be as follows.

A porous silicon composite cluster according to an embodiment and a carbonaceous material may be mixed together and thermally treated.

The thermal treatment may be performed at a temperature of about 600° C. to about 1,100° C., for example about 700° C. to about 1,000° C. When the thermal treatment temperature is within these ranges, a carbon composite with improved capacity characteristics may be attained.

In an embodiment, a porous silicon composite cluster or a carbon composite according to one of the above-described embodiments may be used in, for example, a battery, a field emission material for a display, a thermoelectric device, a biosensor, or the like.

According to another embodiment, an electrode includes a porous silicon composite cluster or a carbon composite according to one of the above-described embodiments. The electrode may be an electrode for a lithium battery. The electrode may be a negative electrode.

The porous silicon composite cluster or the carbon composite may be used as an electrode active material, for example, a negative active material. In this regard, when the porous silicon composite cluster or the carbon composite is used as a negative active material, volume expansion and disintegration of silicon may be reduced or prevented. The negative active material may have improved conductivity, and may improve the high-rate characteristics of a battery. Moreover, since a small amount of graphene may be coated on the silicon covered with the silicon oxide layer, the negative active material may have an improved energy density per unit volume. A lithium battery may be provided which may include the porous silicon composite cluster or the carbon composite.

In an embodiment, the negative electrode may be manufactured in the following manner.

The negative electrode may be formed by molding, into a predetermined shape, a negative active material composition which may include, for example, a porous silicon composite cluster or a carbon composite according to an embodiment as a negative active material, a conducting agent, and a binder, or the negative electrode may be formed by coating the negative active material composition on a current collector, such as a copper (Cu) foil. In another embodiment, the negative active material composition may not include a conducting agent.

In an embodiment, the negative active material composition may be formed as a film on a separator without the current collector.

In an embodiment, the negative active material composition may be prepared by mixing the negative active material, a conducting agent, a binder, and a solvent. The negative active material composition may be directly coated on a metal current collector to form a negative electrode plate. In an embodiment, the negative active material composition may be cast onto a separate support to form a negative active material film. The negative active material film may be separated from the support and then laminated on a metal current collector to thereby form a negative electrode. The negative electrode is not limited to having the above-listed forms, and may have any one of a variety of suitable forms.

The negative active material composition may further include a carbonaceous negative active material, in addition to the above-described negative active material. For example, the carbonaceous negative active material may be natural graphite, artificial graphite, expansion graphite, graphene, carbon black, fullerene soot, carbon nanotubes, carbon fibers, or a combination comprising at least one of the foregoing. However, embodiments are not limited thereto. Any suitable carbonaceous negative active material, including those available in the art, may be used.

The conducting agent may be acetylene black, ketjen black, natural graphite, artificial graphite, carbon black, carbon fibers, or a metal powder or metal fibers of copper, nickel, aluminum, or silver; or a combination comprising at least one of the foregoing. The conducting agent may include one or more conductive materials, such as a polyphenylene derivative, in combinations thereof. However, embodiments are not limited thereto. Any suitable conducting agent, including those available in the art, may be used.

The binder may be a vinylidene fluoride/hexafluoropropylene copolymer, polyvinylidenefluoride (PVDF), polyacrylonitrile, poly(methyl(meth)acrylate), polytetrafluoroethylene, a styrene-butadiene rubber-based polymer, polyacrylic acid, polyamide imide, polyimide, or a combination comprising at least one of the foregoing. However, embodiments are not limited thereto. Any suitable binder, including those available in the art, may be used.

The solvent may be N-methylpyrrolidone (NMP), acetone, water, or a combination comprising at least one of the foregoing. However, embodiments are not limited thereto. Any suitable solvent, including those available in the art, may be used.

The amounts of the negative active material, the conducting agent, the binder, and the solvent may be the same as those suitably used in lithium batteries. At least one of the conducting agent, the binder, and the solvent may be omitted depending on the use and structure of a lithium battery.

In an embodiment, a lithium battery may include the negative electrode. The lithium battery may be manufactured in the following manner.

First, a negative electrode may be manufactured according to the above-described method of manufacturing a negative electrode.

Next, a positive active material composition may be prepared by mixing a positive active material, a conducting agent, a binder, and a solvent. The positive active material composition may be directly coated on a metal current collector and dried to manufacture a positive electrode. In another embodiment, the positive active material composition may be cast on a separate support to form a positive active material layer. The positive active material layer may then be separated from the support and then laminated on a metal current collector, to thereby manufacture a positive electrode.

The positive active material may include a composite lithium metal oxide, for example, lithium cobalt oxide, lithium nickel cobalt manganese oxide, lithium nickel cobalt aluminum oxide, lithium iron phosphorous oxide, lithium manganese oxide, or a combination comprising at least one of the foregoing. However, embodiments are not limited thereto. Any suitable positive active material, including those available in the art, may be used.

For example, the positive active material may be a composite lithium metal oxide with cobalt (Co), manganese (Mn), nickel (Ni), or a combination comprising at least one of the foregoing. For example, the positive active material may be a compound represented by one of the following formulae: $Li_aA_{1-b}B'_bD_2$ (wherein $0.90 \le a \le 1$, and $0 \le b \le 0.5$); $Li_aE_{1-b}B'_bO_{2-c}D_c$ (wherein $0.90 \le a \le 1$, $0 \le b \le 0.5$, and $0 \le c \le 0.05$); $LiE_{2-b}B'_bO_{4-c}D_c$ (wherein $0 \le b \le 0.5$, $0 \le c \le 0.05$); $Li_aNi_{1-b-c}Co_bB'_cD_\alpha$ (wherein $0.90 \le a \le 1$, $0 \le b \le 0.5$, $0 \le c \le 0.05$, and $0 \le \alpha \le 2$); $Li_aNi_{1-b-c}Co_bB'_cO_{2-\alpha}F'_\alpha$ (wherein $0.90 \le a \le 1$, $0 \le b \le 0.5$, $0 \le c \le 0.05$, and $0 < \alpha 2$); $Li_aNi_{1-b-c}Co_bB_cO_{2-\alpha}F'_2$ (wherein $0.90 \le a \le 1$, $0 \le b \le 0.5$, $0 \le c \le 0.05$, and $0 < \alpha 2$); $Li_aNi_{1-b-c}Mn_bB'_cD_\alpha$ (wherein $0.90 \le a \le 1$, $0 \le b \le 0.5$, $0 \le c \le 0.05$, and $0 < \alpha \le 2$); $Li_aNi_{1-b-c}Mn_bB'_cO_{2-\alpha}F'_\alpha$ (wherein $0.90 \le a \le 1$, $0 \le b \le 0.5$, $0 \le c \le 0.05$, and $0 < \alpha$-2); $Li_aNi_{1-b-c}Mn_bB'_cO_{2-\alpha}F'_2$ (wherein $0.90 \le a \le 1$, $0 \le b \le 0.5$, $0 \le c \le 0.05$, and $0 < \alpha < 2$); $Li_aNi_bE_cG_dO_2$ (wherein $0.90 \le a \le 1$, $0 \le b \le 0.9$, $0 \le c \le 0.5$, and $0.001 \le d \le 0.1$); $Li_aNi_bCo_c Mn_dGeO_2$ (wherein $0.90 \le a \le 1$, $0 \le b \le 0.9$, $0 \le c \le 0.05$, and $0.001 \le e \le 0.1$); $Li_aNiG_bO_2$ (wherein $0.90 \le a \le 1$ and $0.001 \le b \le 0.1$); $Li_aCoG_bO_2$ (wherein $0.90 \le a \le 1$, and $0.001 \le b \le 0.1$); $Li_aMnG_bO_2$ (wherein $0.90 \le a \le 1$ and $0.001 \le b \le 0.1$); $Li_aMn_2G_bO_4$ (wherein $0.90 \le a \le 1$ and $0.001 \le b \le 0.1$); $QO_2$; $QS_2$; $LiQS_2$; $V_2O_5$; $LiV_2O_5$; $LiI'O_2$; $LiNiVO_4$; $Li_{(3-f)}J_2(PO_4)_3$ (wherein $0 \le f \le 2$); $Li_{(3-f)}Fe_2(PO_4)_3$ (wherein $0 \le f \le 2$); $LiFePO_4$; or a combination comprising at least one of the foregoing.

In the formulae above, A may be nickel (Ni), cobalt (Co), manganese (Mn), or a combination comprising at least one of the foregoing; B' may be aluminum (Al), nickel (Ni), cobalt (Co), manganese (Mn), chromium (Cr), iron (Fe), magnesium (Mg), strontium (Sr), vanadium (V), a rare earth element, or a combination comprising at least one of the foregoing; D may be oxygen (O), fluorine (F), sulfur (S), phosphorus (P), or a combination comprising at least one of the foregoing; E may be cobalt (Co), manganese (Mn), or a combination thereof; F' may be fluorine (F), sulfur (S), phosphorus (P), or a combination comprising at least one of the foregoing; G may be aluminum (Al), chromium (Cr), manganese (Mn), iron (Fe), magnesium (Mg), lanthanum (La), cerium (Ce), strontium (Sr), vanadium (V), or a combination comprising at least one of the foregoing; Q may be titanium (Ti), molybdenum (Mo), manganese (Mn), or a combination comprising at least one of the foregoing; I' may be chromium (Cr), vanadium (V), iron (Fe), scandium (Sc), yttrium (Y), or a combination comprising at least one of the foregoing; and J may be vanadium (V), chromium (Cr), manganese (Mn), cobalt (Co), nickel (Ni), copper (Cu), or a combination comprising at least one of the foregoing.

For example, the positive active material may be $LiNiO_2$, $LiCoO_2$, $LiMn_xO_{2x}$ (wherein x may be 1 or 2), $LiNi_{1-x}Mn_xO_2$ (wherein $0<x<1$), $LiNi_{1-x-y}Co_xMn_yO_2$ (wherein $0 \le x \le 0.5$ and $0 \le y \le 0.5$), $LiFeO_2$, $V_2O_5$, TiS, MoS, or a combination comprising at least one of the foregoing.

The compounds listed above as positive active materials may have a surface coating layer (hereinafter, "coating layer"). Alternatively, a mixture of a compound without a coating layer and a compound having a coating layer, the compounds being the compounds listed above, may be used. The coating layer may include at least one compound of an oxide, hydroxide, oxyhydroxide, oxycarbonate, hydroxycarbonate, or a combination comprising at least one of the foregoing. The compounds for the coating layer may be amorphous or crystalline. The coating element for the coating layer may be magnesium (Mg), aluminum (Al), cobalt (Co), potassium (K), sodium (Na), calcium (Ca), silicon (Si), titanium (Ti), vanadium (V), tin (Sn), germanium (Ge), gallium (Ga), boron (B), arsenic (As), zirconium (Zr), or a combination comprising at least one of the foregoing. The coating layer may be formed by any suitable method that does not substantially adversely affect the physical properties of the positive active material when a compound of the coating element is used, for example, by a spray coating method, a dipping method, or the like. This is known to those of skill in the art, and thus a detailed description thereof will be omitted.

The conducting agent, binder, and solvent used in the positive active material composition may be the same as those used in the negative active material composition described above. In an embodiment, a plasticizer may further be included in the positive active material composition and/or the negative active material composition to obtain an electrode plate including pores.

The amounts of the positive active material, the conducting agent, the binder, and the solvent may be the same as those suitably used in lithium batteries. At least one of the conducting agent, the binder, and the solvent may be omitted depending on the use and structure of a lithium battery.

Next, a separator to be disposed between the positive electrode and the negative electrode may be prepared. The separator may be any suitable separator material used in lithium batteries. In an embodiment, the separator material may have a low resistance to migration of ions in an electrolyte and have a good electrolyte-retaining ability. For example, the separator material may be glass fiber, polyester, Teflon, polyethylene, polypropylene, polytetrafluoroethylene (PTFE), or a combination comprising at least one of the foregoing, each of which may be a non-woven or woven fabric. For example, a rollable separator including polyethylene or polypropylene may be used in a lithium ion battery. A separator or separator material with a suitable organic electrolytic solution-retaining ability may be used in a lithium ion polymer battery. For example, the separator may be manufactured in the following manner.

In an embodiment, a polymer resin, a filler, and a solvent may be combined, for example by mixing, to prepare a separator composition. Then, the separator composition may be directly coated on a support and then dried to thereby form the separator. In another embodiment, the separator composition may be cast on a support and dried to form a separator film. The separator film may be separated from the support and laminated on an electrode to thereby form the separator.

The polymer resin used to manufacture the separator may be any suitable material used as a binder for electrode plates, including those available in the art. For example, the polymer resin may be a vinylidene fluoride/hexafluoropropylene copolymer, PVDF, polyacrylonitrile, poly(methyl(meth)acrylate), or a combination comprising at least one of the foregoing.

The separator may include a ceramic composition to improve the separator functioning as a membrane. For example, the separator may be coated with an oxide or may be formed to include ceramic particles.

Next, an electrolyte may be prepared.

For example, the electrolyte may be an organic electrolyte. The electrolyte may be solid. For example, the electrolyte may be a boron oxide, a lithium oxynitride, or a combination comprising at least one of the foregoing. However, embodiments are not limited thereto. Any suitable solid electrolyte, including those available in the art, may be used.

The solid electrolyte may be formed on the negative electrode by a suitable method, for example, by sputtering.

For example, an organic electrolyte may be prepared. The organic electrolyte may be prepared by dissolving a lithium salt in an organic solvent.

The organic solvent may be any suitable organic solvent, including those available in the art. For example, the organic solvent may be propylene carbonate, ethylene carbonate, fluoroethylene carbonate, butylene carbonate, dimethyl carbonate, diethyl carbonate, methylethyl carbonate, methylpropyl carbonate, ethylpropyl carbonate, methylisopropyl carbonate, dipropyl carbonate, dibutyl carbonate, chloroethylene carbonate, benzonitrile, acetonitrile, tetrahydrofuran, 2-methyltetrahydrofuran, γ-butyrolactone, dioxolane, 4-methyldioxolane, N,N-dimethyl formamide, N,N-dimethyl acetamide, N,N-dimethylsulfoxide, dioxane, 1,2-dimethoxyethane, sulfolane, dichloroethane, chlorobenzene, nitrobenzene, diethylene glycol, dimethyl ether, or a combination comprising at least one of the foregoing.

The lithium salt may be any suitable lithium salt, including those available in the art. For example, the lithium salt may be $LiPF_6$, $LiBF_4$, $LiSbF_6$, $LiAsF_6$, $LiClO_4$, $LiCF_3SO_3$, $Li(CF_3SO_2)_2N$, $LiC_4F_9SO_3$, $LiAlO_2$, $LiAlCl_4$, $LiN(C_xF_{2x+1}SO_2)(C_yF_{2y+1}SO_2)$ (wherein x and y may be natural numbers), LiCl, LiI, or a combination comprising at least one of the foregoing.

Figure 2A:
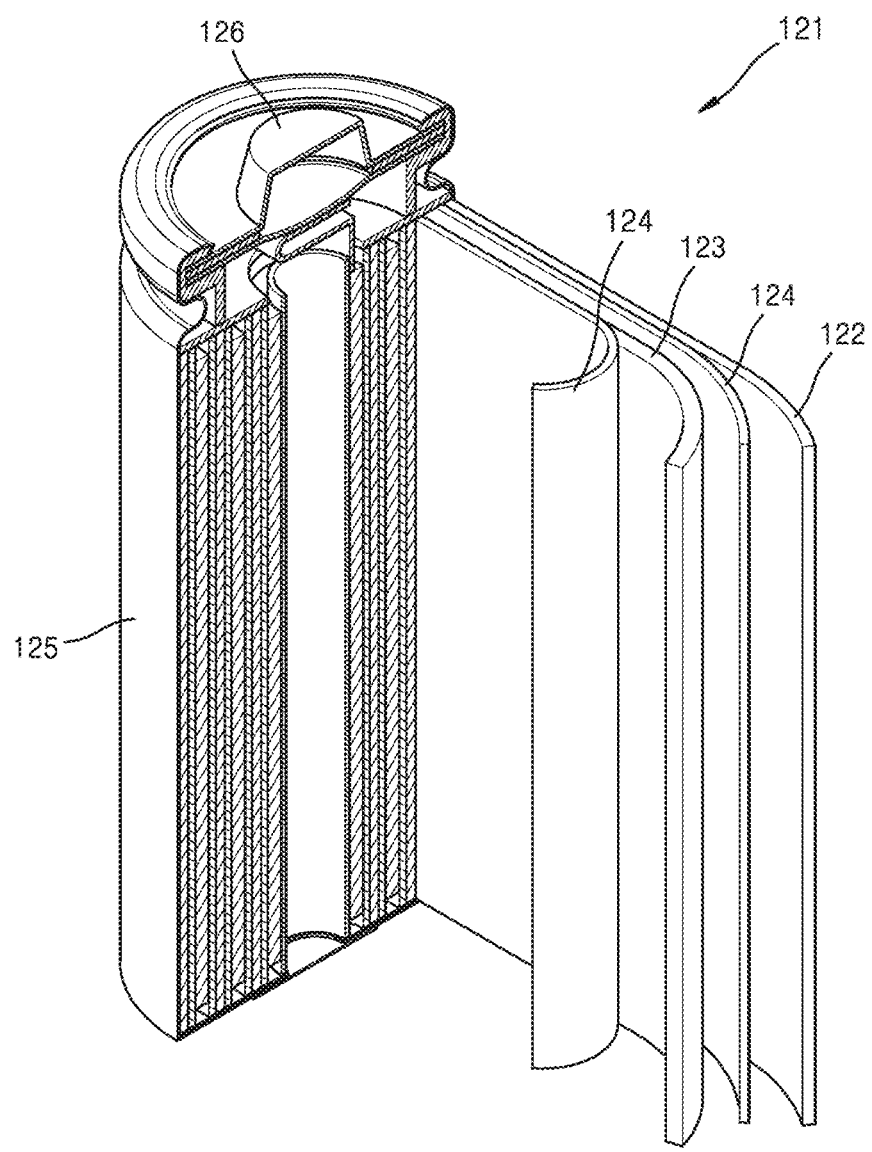
FIG. 2A is an exploded perspective view of an embodiment of a lithium battery according.

Referring to FIG. 2A, a lithium battery 121 according to an embodiment may include a positive electrode 123, a negative electrode 122, and a separator 124. The positive electrode 123, the negative electrode 122, and the separator 124 may be wound or folded, and then sealed in a battery case 125. Then, the battery case 125 may be filled with an organic liquid electrolyte and sealed with a cap assembly 126, thereby completing the manufacture of the lithium battery 121. The battery case 125 may be a cylindrical type, a rectangular type, or a thin-film type. For example, the lithium battery 121 may be a thin-film type battery. For example, the lithium battery 121 may be a lithium ion battery.

The separator 124 may be interposed between the positive electrode 123 and the negative electrode 122 to form a battery assembly. A plurality of such battery assemblies may be stacked in a bi-cell structure and impregnated with an organic electrolyte solution. The resultant battery assembly may then be put into a pouch and hermetically sealed to thereby complete the manufacture of a lithium ion battery.

In an embodiment, a plurality of battery assemblies may be stacked upon one another to form a battery pack, which may be used in any device that requires high capacity and high output, for example, in a laptop computer, a smartphone, an electric vehicle, or the like.

A lithium battery including such a battery pack may have improved high-rate characteristics and lifetime characteristics, and thus may be applicable in an electric vehicle (EV), for example, in a hybrid vehicle such as plug-in hybrid electric vehicle (PHEV).

According to another embodiment of the present disclosure, a field emission device includes a porous silicon composite cluster or a carbon composite according to any one of the embodiments.

The field emission device is a device using migration of electrons. The field emission device may include, at least, a reduction electrode, an emitter tip, and an oxidation electrode separated from the reduction electrode (refer to U.S. Pat. Nos. 7,009,331; 6,976,897; 6,911,767; and US 2006/0066217, the disclosures of which are incorporated in their entirety by reference). The emitter tip may emit electrons as a voltage is applied between the reduction electrode and the oxidation electrode. The electrons may migrate from the reduction electrode toward the oxidation electrode. A field emission device according to an embodiment of the present disclosure may be used for various purposes, for example, in ultrasonic vacuum tube equipment (for example, an X-ray tube), a power amplifier, an ion gun, a high-energy accelerator, a free-electron laser, or an electron microscope, and in an embodiment, in a flat display device. A flat display device may be used as an alternative to a positive electrode tube, and may also be applicable in a TV or a computer monitor.

The porous silicon composite cluster or a carbon composite according to any one of the embodiments may be used as the emitter tip.

The emitter tip may be manufactured using a metal such as molybdenum (Mo) or a semiconductor such as silicon. One of the concerns with using the metal emitter is a comparatively high control voltage of about 100V required for emission. In addition, due to nonuniformity of such emitter tips, current densities of individual pixels of a field emission device using the emitter tips may be nonuniform.

When a porous silicon composite cluster or carbon composite according to any one of the embodiments is used as the emitter tip, the field emission device may have improved field emission characteristics.

The porous silicon composite cluster or carbon composite according to any one of the embodiments may be used to manufacture an electroluminescent device.

According to another embodiment of the present disclosure, a biosensor includes a porous silicon composite cluster or a carbon composite according to any one of the above-described embodiments.

The porous silicon composite cluster or carbon composite according to any one of the embodiments may be used to form an electrode for a biosensor.

Figure 2B:
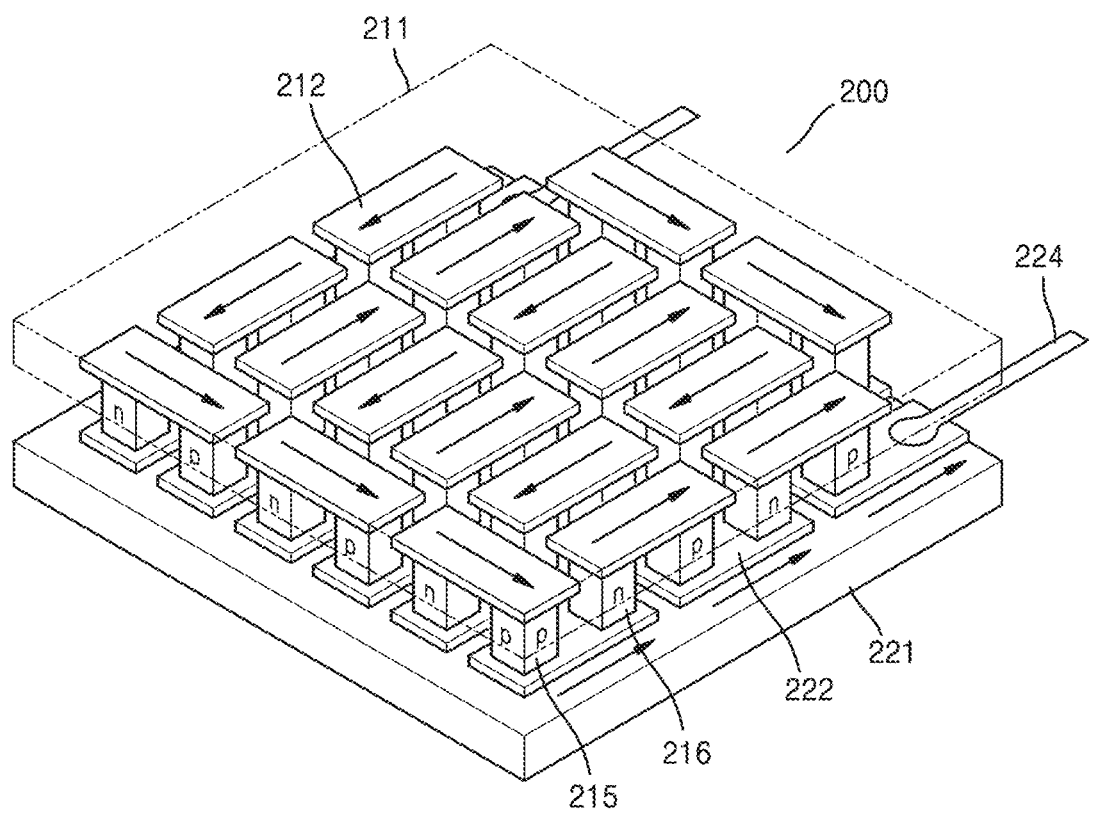
FIG. 2B is a perspective view of an embodiment of a thermoelectric module.
Figure 2C:
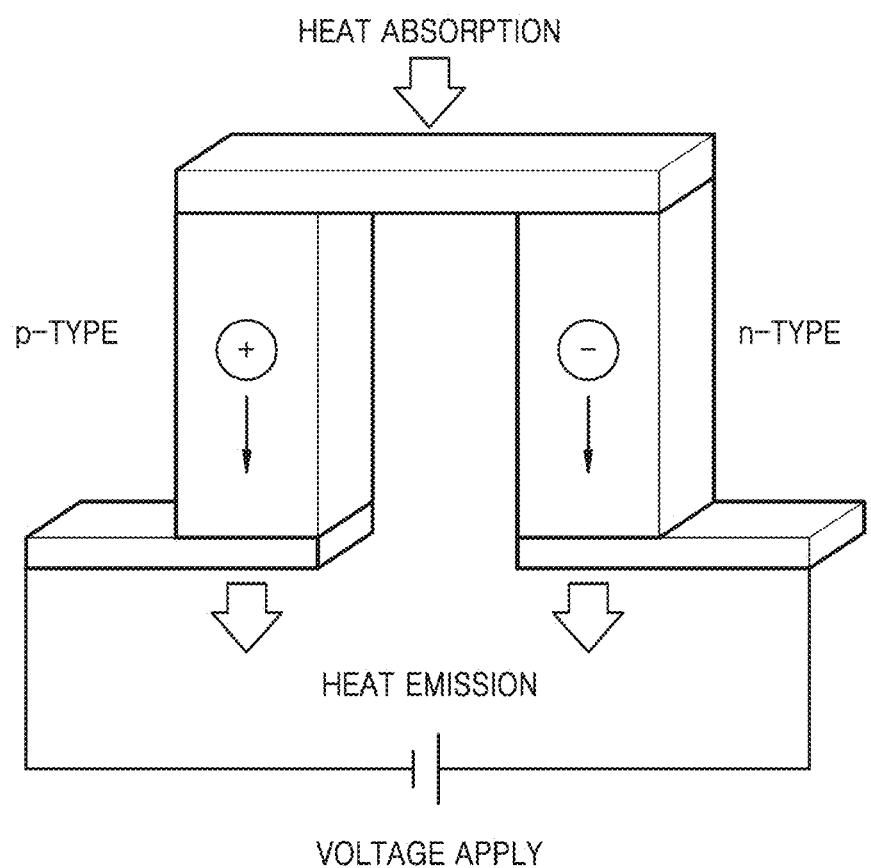
FIG. 2C is a schematic diagram illustrating an embodiment of a thermoelectric cooler using the Peltier effect.
Figure 2D:
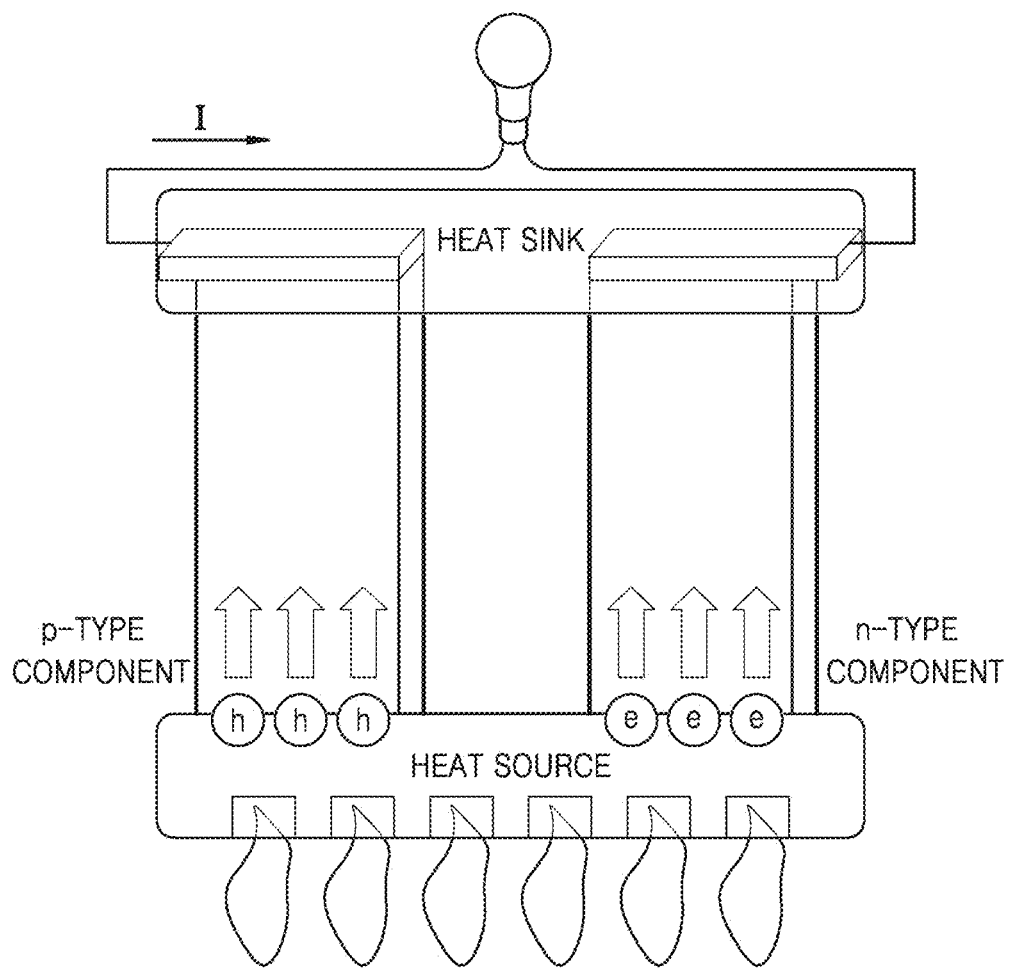
FIG. 2D is a schematic diagram illustrating an embodiment of a thermoelectric generator using the Seebeck effect.
Figure 2E:
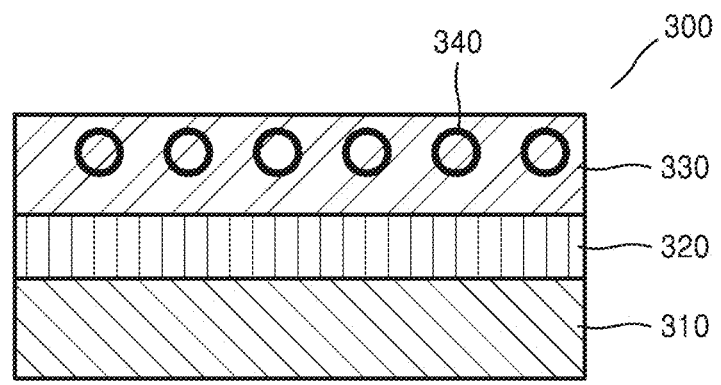
FIG. 2E is cross sectional view that illustrates a structure of an embodiment of an electrode of a biosensor according to an exemplary embodiment.

FIG. 2E is a cross-sectional view illustrating a structure of an electrode of a biosensor 300 according to an embodiment of the present disclosure.

Referring to FIG. 2E, the electrode of a biosensor 300 may include a substrate 310, a first layer 320 on the substrate 310, the first layer 320 including a porous silicon composite cluster or carbon composite according to any one of the embodiments, and a second layer 330 on the first layer 320. A biomaterial 340 may be supported by or fixed in the second layer 330 in a variety of manners.

The substrate 310 may be any suitable plate on which graphene may be deposited or formed, and for example, may be glass, plastic, metal, ceramic, silicon, or a combination comprising at least one of the foregoing. The type of the substrate 310 is not specifically limited, provided that graphene may be deposited or formed thereon.

The biomaterial 340 may be enzymes, aptamers, proteins, nucleic acids, microorganisms, cells, lipids, hormones, DNA, PNA, RNA, or a combination comprising at least one of the foregoing. Any of various suitable biomaterials, not already stated herein, may also be used.

Referring to FIG. 2E, in the electrode of a biosensor 300, the biomaterial 340 may be an enzyme, and the second layer 330 may be a layer able to support or fix the enzyme therein. Although according to FIG. 2E an enzyme as the biomaterial 340 appears as being supported or fixed in the second layer 330, the location of the enzyme is not limited thereto, and the enzyme may partially or entirely protrude through the surface of the second layer 330 and be exposed (not shown). When a biosensor has this structure including an enzyme with substrate specificity to selectively respond to a target molecule in a mixture, the biosensor may selectively sense an analyte (for example, blood sugar) to which the enzyme responds.

According to another embodiment of the present disclosure, a semiconductor device includes a porous silicon composite cluster or a carbon composite i according to any one of the above-described embodiments.

The porous silicon composite cluster or the carbon composite may be used as an electrode of the semiconductor device.

According to another embodiment of the present disclosure, there are provided a thermoelectric material and a thermoelectric device, each including a porous silicon composite cluster or a carbon composite according to any one of the above-described embodiments.

The thermoelectric material may have good electrical characteristics, and consequently may have improved thermoelectric performance. The thermoelectric material may be used in a thermoelectric device, a thermoelectric module, or a thermoelectric system.

The performance of the thermoelectric material is evaluated using a dimensionless figure of merit (ZT), which is defined by Equation 1.

$$ZT=(S^2\sigma T)/k \qquad \text{Equation 1}$$

In Equation 1, ZT is a figure of merit, S is a Seebeck coefficient, σ is an electrical conductivity, T is an absolute temperature, and k is a thermal conductivity.

As represented in Equation 1, a higher ZT value of a thermoelectric material may be obtained by increasing the Seebeck coefficient (S) and the electrical conductivity (σ) of the thermoelectric material, i.e., a power factor ($S^2\sigma$), and reducing the thermal conductivity (k) of the thermoelectric material.

The porous silicon composite cluster or carbon composite according to any one of the above-described embodiments includes graphene, and thus may provide high electrical conductivity and low thermal conductivity to a thermoelectric material when included therein, according to the characteristics of the graphene, and thus improve the performance of the thermoelectric material.

In a porous silicon composite cluster or carbon composite according to any one of the above-described embodiments, crystalline characteristics and an electron structure may be changed at an interface between the metallic graphene and semi-conductive silicon to increase a Seebeck coefficient thereof and accelerate transfer of charge particles, which may consequently induce an increase in electrical conductivity and charge mobility. In addition, phonon scattering at the interface between the graphene and silicon may be increased so that it may be possible to control the thermal conductivity of the thermoelectric material.

The porous silicon composite cluster or carbon composite according to any one of the above-described embodiments may be effectively used as a thermoelectric material. A thermoelectric device may be manufactured by processing the thermoelectric material into a shape, for example, by cutting. The thermoelectric device may be a p-type thermoelectric device. The thermoelectric device may be a structure formed by shaping the thermoelectric material in a predetermined shape, for example, in a rectangular parallelepiped shape.

The thermoelectric device may have a cooling effect when combined with an electrode and a current is applied thereto, and may have a power generation effect based on a temperature difference.

FIG. 2B is a schematic view of a thermoelectric module 200 using a thermoelectric device according to an embodiment of the present disclosure. Referring to FIG. 2B, an upper electrode (first electrode) 212 and a lower electrode (second electrode) 222 are patterned on an upper insulating substrate 211 and a lower insulating substrate 221, respectively. The upper electrode 212 and the lower electrode 222 may contact a p-type thermoelectric component 215 and an n-type thermoelectric component 216. The upper electrode 212 and the lower electrode 222 may be connected to the outside of the thermoelectric device by a lead electrode 224. The p-type thermoelectric component 215 may be a thermoelectric device according to any one of the above-described embodiments. The n-type thermoelectric component 216 may not be specifically limited, and may be any suitable material known in the art.

The upper and lower insulating substrates 211 and 221 may include gallium arsenide (GaAs), sapphire, silicon, Pyrex, quartz, or a combination comprising at least one of the foregoing. The upper and lower electrodes 212 and 222 may include, for example, copper, aluminum, nickel, gold, titanium, or a combination comprising at least one of the foregoing, and may have various sizes. The upper and lower electrodes 212 and 222 may be formed using any suitable patterning method, for example, a lift-off semiconductor process, a deposition method, a photolithography technique, or a combination comprising at least one of the foregoing.

In an embodiment, one of the upper and lower electrodes 212 and 222 in the thermoelectric module 200 may be exposed to a heat source as illustrated in FIG. 2D. In another embodiment, one of the upper and lower electrodes 212 and 222 in the thermoelectric device module 200 may be electrically connected to a power supply source, as illustrated in FIG. 2C, or to the outside of the thermoelectric module 200, for example, an electric device (for example, a light) that consumes electric power. In still another embodiment, the electric device may be a battery that stores electric power.

One or more embodiments of the present disclosure will now be described in detail with reference to the following examples. However, these examples are only for illustrative purposes and are not intended to limit the scope of the one or more embodiments of the present disclosure.

EXAMPLES

Preparation Example 1

Needle-like silicon was pulverized to obtain plate- and needle-like silicon particles having a length of about 125 nm and a thickness of about 40 nm, and having a silicon oxide ($SiO_x$, wherein $0<x<2$) film layer (having a thickness of about 0.1 nm) on a surface thereof.

A composition including 25 parts by weight of the plate- and needle-like silicon particles, 10 parts by weight of stearic acid, and 65 parts by weight of isopropyl alcohol was spray-dried, and then dried to obtain porous silicon secondary particles having an average particle diameter in a range of about 3 μm to about 6 μm.

The spray-drying was performed using a spray drier (MMSD Micro Mist Spray Dryers, Fujisaki Electric). The spray nozzle size, pressure under a $N_2$ atmosphere, and powder spray temperature (80-200° C.) were controlled, and then the resultant was dried to prepare a cluster from which alcohols were removed.

The porous silicon secondary particles were loaded into a reactor. A gas including methane ($CH_4$, 300 sccm) was supplied into the reactor to create an atmosphere of the gas.

The pressure level inside the reactor resulting from the supply of the gas was 1 atm. The internal temperature of the reactor was increased to 1000° C. (at a rate of about 23° C./min) under the atmosphere of the gas, and while the gas was continuously supplied into the reactor, thermal treatment was performed at 1000° C. for about 1 hour. The resulting product was left for about 4 hours, so that graphene nanosheets were formed on the needle-like silicon particles. Then, the supply of the gas was stopped, and the reactor was cooled down to room temperature (25° C.), thereby obtaining a porous silicon composite cluster including a core containing a porous silicon composite secondary particle and a shell including the second graphene containing highly crystalline graphene flake on the core, the porous silicon composite secondary particle including an aggregate of two or more silicon composite primary particles including silicon, silicon oxide ($SiO_x$, where $0<x<2$) disposed on the silicon, and the first graphene disposed on the silicon oxide.

The total amount of the first graphene and the second graphene in the porous silicon composite cluster was about 20 parts by weight, based on 100 parts by weight of a total weight of the porous silicon composite cluster.

Preparation Example 2

A porous silicon composite cluster was obtained in the same manner as in Preparation Example 1, except that the internal temperature of the reactor was increased to 1,000° C. (at a rate of about 23° C./min) under the atmosphere of the gas, and while the gas was continuously supplied into the reactor, thermal treatment was performed at that temperature for about 2 hours.

The total amount of the first graphene and the second graphene in the porous silicon composite cluster was about 30 parts by weight, based on 100 parts by weight of a total weight of the porous silicon composite cluster.

Preparation Example 3

A porous silicon composite cluster was obtained in the same manner as in Preparation Example 1, except that the internal temperature of the reactor was increased to 1,000° C. (at a rate of about 23° C./min) under the atmosphere of the gas, and while the gas was continuously supplied into the reactor, thermal treatment was performed at that temperature for about 3 hours.

The total amount of the first graphene and the second graphene in the porous silicon composite cluster was about 30 parts by weight, based on 100 parts by weight of a total weight of the porous silicon composite cluster.

Preparation Examples 4 to 6

Porous silicon composite clusters were prepared in the same manner as in Preparation Examples 1 to 3, respectively, except that plate- and needle-like silicon particles having a length of about 108 nm and a thickness of about 40 nm were used, instead of the plate- and needle-like silicon particles having a length of about 125 nm and a thickness of about 40 nm.

Preparation Example 7

A porous silicon composite cluster was prepared in the same manner as in Preparation Example 4, except that a composition including 25 parts by weight of plate- and needle-like silicon particles, 5 parts by weight stearic acid, and 70 parts by weight of isopropyl alcohol was used, based on a total weight of the composition.

Comparative Preparation Example 1

A composition including 20 parts by weight of granule-like silicon having a size) of 10 μm, 10 parts by weight of stearic acid, and 70 parts by weight of isopropyl alcohol, based on the total weight of the composition, was pulverized to prepare a slurry including needle-like silicon particles. The slurry was dried without a spraying process. A secondary-particle cluster was prepared by spray-drying the slurry.

The resulting product was pulverized to obtain needle-like silicon particles having a length of 125 nm and having a silicon oxide ($SiO_x$, where $0<x<2$) film (having a thickness of about 0.1 nm).

The needle-like silicon particles were loaded into a reactor. A gas including nitrogen ($N_2$, 300 sccm) was supplied into the reactor to create an atmosphere of the gas. The pressure level inside the reactor resulting from the supply of the gas was 1 atm. The internal temperature of the reactor was increased to 950° C. (at a rate of about 23° C./min) under the atmosphere of the gas, and while the gas was continuously supplied into the reactor, thermal treatment was performed at that temperature for about 3 hours. The resulting product was left for about 4 hours to obtain porous silicon primary particles having a needle-like shape.

Comparative Preparation Example 2

Granule-like silicon having a size of 10 μm was pulverized to obtain plate- and needle-like silicon particles having a length of about 125 nm and a thickness of about 40 nm, and having a silicon oxide ($SiO_x$, where $0<x<2$) film (having a thickness of about 0.1 nm) on a surface thereof.

The plate- and needle-like silicon particles were loaded into a reactor. A gas including methane ($CH_4$, 300 sccm) was supplied into the reactor to create an atmosphere of the gas. The pressure level inside the reactor resulting from the supply of the gas was 1 atm. The internal temperature of the reactor was increased to 1,000° C. (at a rate of about 23° C./min) under the atmosphere of the gas, and while the gas was continuously supplied into the reactor, thermal treatment was performed at 1,000° C. for about 1 hour. The resulting product was left for about 4 hours, so that graphene nanosheets were formed on the plate- and needle-like silicon particles. Then, the supply of the gas was stopped, and the reactor was cooled down to room temperature (25° C.), thereby obtaining silicon composite primary particles.

The silicon composite primary particles had a structure including plate- and needle-like silicon, silicon oxide ($SiO_x$, where $0<x<2$) on the silicon, and graphene on the silicon oxide.

The amount of the graphene in the silicon composite primary particles was about 85 parts by weight, based on 100 parts by weight of a total weight of the silicon composite primary particles.

Comparative Preparation Example 3

Granule-like silicon having a size of 10 μm was pulverized to obtain plate- and needle-like silicon particles having a length of about 125 nm and a thickness of about 40 nm, and having a silicon oxide ($SiO_x$, where $0<x<2$) film (having a thickness of about 0.1 nm) on a surface thereof.

About 20 parts by weight of the plate- and needle-like silicon particles and 80 parts by weight of graphite were mixed to obtain a mixture, based on the total weight of the mixture, and the mixture was thermally treated at about 1,000° C. to prepare a silicon composite.

Comparative Preparation Example 4

Plate-like silicon was pulverized to obtain needle-like silicon particles having a length of about 125 nm and having a silicon oxide ($SiO_x$, where $0<x<2$) film (having a thickness of about 0.1 nm) on a surface thereof.

A composition containing 10 parts by weight of stearic acid and 90 parts by weight of isopropyl alcohol was sprayed onto the needle-like silicon particles and then dried to obtain silicon secondary particles having an average particle diameter of about 5 μm.

The silicon secondary particles were loaded into a reactor. A gas including nitrogen ($N_2$, 300 sccm) was supplied into the reactor to create an atmosphere of the gas. The pressure level inside the reactor resulting from the supply of the gas was 1 atm. The internal temperature of the reactor was increased to 950° C. (at a rate of about 23° C./min) under the atmosphere of the gas, and while the gas was continuously supplied into the reactor, thermal treatment was performed at 1,000° C. for about 3 hours. The resulting product was left for about 4 hours to obtain porous silicon secondary particles.

The porous silicon secondary particles had a structure in which a carbon coating layer derived from the stearic acid existed on surfaces of the plate- and needle-like silicon particles.

Comparative Preparation Example 5

To prepare silicon composite secondary particles, the silicon composite primary particles of Comparative Preparation Example 2 were further left for about 3 hours. However, this failed to obtain silicon composite secondary particles having a uniform, micro-size. The resulting product did not have a double core/shell structure.

Example 1

Manufacture of Negative Electrode and Coin Cell

Porous silicon composite cluster of Preparation Example 1, graphite, carbon black (KB600JD), lithium polyacrylate (Li-PAA), and N-methylpyrrolidone (NMP) as a solvent were mixed to prepare a slurry. A ratio of a mixture of the porous silicon composite cluster of Preparation Example 1 and graphite, carbon black (KB600JD), and lithium polyacrylate in the slurry was about 91:1:8 by weight on a solid content basis. A ratio of the porous silicon composite cluster of Preparation Example 1 to graphite in the mixture was about 7:84 (1:12) by weight.

The slurry was applied to a copper (Cu) foil using a doctor blade to form a film having a thickness of about 40 μm. The film was vacuum-dried at about 120° C. for about 2 hours and roll-pressed, thereby manufacturing a negative electrode.

A positive electrode was manufactured using a slurry obtained by mixing $LiNi_{0.6}Co_{0.2}Mn_{0.2}O_2$, Super P, lithium polyacrylate (Li-PAA) as a binder, and NMP as a solvent. A mixed ratio by weight of $LiNi_{0.6}Co_{0.2}Mn_{0.2}O_2$, Super P, and Li-PAA as a binder, in the slurry was about 93:5:2. The slurry was applied to an aluminum (Al) foil using a doctor blade to form a film having a thickness of about 40 μm. The film was vacuum-dried at about 120° C. for about 2 hours and roll-pressed, thereby manufacturing the positive electrode.

A coin cell was manufactured using the negative electrode and the positive electrode. A polypropylene membrane (Celgard 3510) was used as a separator, and an electrolyte was used which included 1.3 molar (M) $LiPF_6$ in a mixture of ethylene carbonate (EC), diethyl carbonate (DEC), and fluoroethylene carbonate (FEC) at a volume ratio of about 2:6:2.

Examples 2 to 7

Manufacture of Negative Electrode and Coin Cell

Negative electrodes and coin cells were manufactured in the same manner as in Example 1, except that the porous silicon composite clusters of Preparation Examples 2 to 7 were used, respectively, instead of the porous silicon composite cluster of Preparation Example 1.

Example 8

Manufacture of Negative Electrode and Coin Cell

The porous silicon composite cluster of Preparation Example 1, carbon black (KB600JD), AST9005 (AEKYUNG, Republic of Korea), and NMP as a solvent were mixed to prepare a slurry. A ratio by weight of the mixture of the porous silicon composite cluster of Preparation Example 1, carbon black (KB600JD), and AST9005 (AEKYUNG, Republic of Korea) was about 79:1:20 on a solid basis.

The slurry was applied to a Cu foil using a doctor blade to form a film having a thickness of about 40 μm. The film was vacuum-dried at about 120° C. for about 2 hours and roll-pressed, thereby manufacturing a negative electrode.

A coin cell (CR2032) was manufactured using the negative electrode and a lithium metal as a counter electrode. A polypropylene membrane (Celgard 3510) was used as a separator, and an electrolyte was used which included 1.3M $LiPF_6$ in a mixture of EC, DEC, and FEC at a volume ratio of about 2:6:2.

Examples 9 to 14

Manufacture of Negative Electrode and Coin Cell

Negative electrodes and coin cells were manufactured in the same manner as in Example 8, except that the porous silicon composite clusters of Preparation Examples 2 to 7 were used, respectively, instead of the porous silicon composite cluster of Preparation Example 1.

Example 15

Manufacture of Negative Electrode and Coin Cell

Negative electrodes and coin cells were manufactured in the same manner as in Example 1, except that the ratio by weight of the mixture of porous silicon composite cluster of Preparation Example 1, carbon black (KB600JD), and lithium polyacrylate on a solid basis was changed from about 91:1:8 to about 82.8:9.2:8.

Example 16

Manufacture of Negative Electrode and Coin Cell

Negative electrodes and coin cells were manufactured in the same manner as in Example 1, except that the ratio by weight of the mixture of the porous silicon composite cluster of Preparation Example 1 and graphite was changed from about 1:12 to about 1:99.

Example 17

Manufacture of Negative Electrode and Coin Cell

Negative electrodes and coin cells were manufactured in the same manner as in Example 1, except that the ratio by weight of the mixture of the porous silicon composite cluster of Preparation Example 1 and graphite was changed from about 1:12 to about 3:97.

Example 18

Manufacture of Negative Electrode and Coin Cell

Negative electrodes and coin cells were manufactured in the same manner as in Example 1, except that the ratio by weight of the mixture of the porous silicon composite cluster of Preparation Example 1 and graphite was changed from about 1:12 to about 1:1.

Comparative Examples 1 to 4

Manufacture of Negative Electrodes and Coin Cells

Negative electrodes and coin cells were manufactured in the same manner as in Example 1, except that porous silicon primary particle of Comparative Preparation Example 1, the silicon composite primary particle of Comparative Preparation Example 2, the silicon composite of Comparative Preparation Example 3, and porous silicon secondary particle of Comparative Preparation Example 4 were used, respectively, instead of the porous silicon composite cluster of Preparation Example 1.

Comparative Examples 5 to 8

Manufacture of Negative Electrodes and Coin Cells

Negative electrodes and coin cells were manufactured in the same manner as in Example 8, except that the porous silicon primary particle of Comparative Preparation Example 1, the silicon composite primary particle of Comparative Preparation Example 2, the silicon composite of Comparative Preparation Example 3, and porous silicon secondary particle of Comparative Preparation Example 4 were used, respectively, instead of the porous silicon composite cluster of Preparation Example 1.

Comparative Example 9

Manufacture of Negative Electrode and Coin Cell

The negative electrode and coin cell was manufactured in the same manner as in Example 1, except that the silicon composite secondary particles of Comparative Preparation Example 5 were used, instead of the porous silicon composite cluster of Preparation Example 1.

Evaluation Example 1

Charge and Discharge Characteristics

Measurement of initial efficiency, rate capability, coulombic efficiency, and discharge capacity 1) Examples 1 to 3, Examples 8 to 10, and Comparative Examples 1 to 8

Charge capacity, discharge capacity, initial efficiency, and capacity retention (CR) ("charge and discharge characteristics") of the coin cells of Examples 1 to 3, Examples 8 to 10, and Comparative Examples 1 to 8 were evaluated according to the following methods.

Examples 1 to 3 and Comparative Examples 1 to 4: Charged under conditions: CC-CV mode 1.0C, 4.2 Volts per 0.01 C (V/0.01C) cut-off and then discharged under conditions: CC-mode 1.0 C per 2.5 Volts (C/2.5V) cut-off.

Examples 8 to 10 and Comparative Examples 5 to 8: Charged under conditions: CC-CV mode 1.0 C, 2.5 Volts per 0.01 C(V/0.01C) cut-off and then discharged under conditions: CC-mode 1.0 C per 1.5 Volts (C/1.5V) cut-off.

The results of evaluating the charge and discharge characteristics are shown in Table 1.

TABLE 1

| Example | Specific Capacity (mAh/g) | Volume Capacity (mAh/cc) | Initial Efficiency[†] (%) | CR[‡] (%) |
|---|---|---|---|---|
| Example 1 | 2200 | 2200 | 83.9 | 76.2 |
| Example 2 | 1900 | 2090 | 85.0 | 78.5 |
| Example 3 | 1880 | 2068 | 86.5 | 81.5 |
| Example 8 | 2200 | 2200 | 90.8 | 96.3 |
| Example 9 | 1900 | 2090 | 90.8 | 96.2 |
| Example 10 | 1880 | 2068 | 91.1 | 96.1 |
| Comparative Example 1 | 2100 | 630 | 67 | 45.1 |
| Comparative Example 2 | 2300 | 1196 | 70.2 | 74.0 |
| Comparative Example 3 | 800 | 800 | 65.2 | 76.2 |
| Comparative Example 4 | 2200 | 1980 | 69.3 | 52.2 |
| Comparative Example 5 | 2100 | 630 | 54.7 | 60.2 |
| Comparative Example 6 | 2300 | 1196 | 86.2 | 94.4 |
| Comparative Example 7 | 800 | 800 | 85.0 | 95.2 |
| Comparative Example 8 | 2200 | 1980 | 72.0 | 72.0 |

[†]Initial efficiency (%) = [discharge capacity at the $1^{st}$ cycle/charge capacity at the $1^{st}$ cycle] × 100%
[‡]Capacity retention (CR; %) = [discharge capacity at 100th cycle/discharge capacity at $1^{st}$ cycle] × 100%

Referring to Table 1, the coin cells of Examples 1-3 had greater initial efficiency and CR compared to Comparative Examples 1-4. The coin cells of Examples 8-10 had greater initial efficiency and CR compared to Comparative Examples 5-8.

2) Examples 3 to 7 and Examples 10 to 14

Charge and discharge characteristics of the coin cells of Examples 3 to 7 and Examples 10 to 14 were evaluated according to the following methods.

Examples 3 to 7: Charging and discharging conditions were the same as used for Examples 1 to 3.

Examples 11 to 14: Charging and discharging conditions (were the same as used for Comparative Examples 5 to 8.

The results of evaluating the charge and discharge characteristics are shown in Table 2.

TABLE 2

| Example | Specific Capacity (mAh/g) | Volume Capacity (mAh/cc) | Initial Efficiency† (%) | CR‡ (%) |
|---|---|---|---|---|
| Example 3 | 1880 | 2068 | 86.5 | 81.5 |
| Example 4 | 1880 | 2068 | 85.8 | 89.6 |
| Example 5 | 1900 | 1805 | 85.0 | 82.5 |
| Example 6 | 1690 | 1521 | 84.5 | 81.2 |
| Example 7 | 1510 | 1329 | 80.8 | 83 |
| Example 10 | 1630 | 1190 | 80.8 | 83 |
| Example 11 | 1900 | 1805 | 89.4 | 98.2 |
| Example 12 | 1690 | 1521 | 89.0 | 97.5 |
| Example 13 | 1510 | 1329 | 88.7 | 97.5 |
| Example 14 | 1630 | 1190 | 82.4 | 97.0 |

†Initial efficiency (%) = [discharge capacity at the 1$^{st}$ cycle/charge capacity at the 1$^{st}$ cycle] × 100%
‡Capacity retention (CR; %) = [discharge capacity at 100th cycle/discharge capacity at 1$^{st}$ cycle] × 100%

Referring to Table 2, the coin cells of Example 3, Examples 4 to 7, and Examples 11 to 14 had good durability. The coin cells of Examples 4 to 7, and 11 to 14 had lower initial efficiency, as compared with the coin cells of Examples 3 and 10.

3) Examples 16 to 18

Charge and discharge characteristics of the coin cells of Examples 16 to 18 were evaluated in the same manner as applied to the coin cell of Example 1. As a result of the evaluation, the coin cells of Examples 16 to 18 were found to have good initial efficiency and lifespan characteristics similar to those of the coin cell of Example 1.

Evaluation Examples 2

Oxygen and Carbon Content

1) Preparation Examples 1 to 3 and Comparative Examples 1 to 4

The oxygen and carbon contents (atomic percent, atom %) of the porous silicon composite clusters of Preparation Examples 1 to 3, the porous silicon primary particle of Comparative Preparation Example 1, the silicon composite primary particle of Comparative Preparation Example 2, and the porous silicon secondary particle of Comparative Preparation Example 4 were analyzed by X-ray photoelectron spectroscopy (XPS). The analysis results are shown in Table 3.

The XPS was performed using a Quantum 2000 (Physical Electronics. Inc., Acceleration voltage: 0.5-15 kilo Volts (kV), 300 watts (W), Energy resolution: about 1.0 eV, and Sputter rate: 0.1 nm/min).

TABLE 3

| Example | Oxygen (atom %) | Carbon (atom %) |
|---|---|---|
| Preparation Example 1 | 3.75 | 20.0 |
| Preparation Example 2 | 3.70 | 30.0 |
| Preparation Example 3 | 3.67 | 30.0 |
| Comparative Preparation Example 1 | 8.9 | ~10 |
| Comparative Preparation Example 2 | 4.8 | 20 |
| Comparative Preparation Example 3 | 3.5 | ~85 |
| Comparative Preparation Example 4 | 6.6 | ~10 |

In Table 3, carbon content was determined based on the carbon content corresponding to C1s peaks, and oxygen content was determined based on the oxygen content corresponding to O1s peaks.

Referring to Table 3, the porous silicon composite clusters of Preparation Examples 1 to 3 were found to have reduced oxygen contents as compared with that of the porous silicon primary particle of Comparative Preparation Example 1, the silicon composite primary particle of Comparative Preparation Example 2, the silicon composite of Comparative Preparation Example 3, and the porous silicon secondary particle of Comparative Preparation Example 4.

2) Preparation Examples 3, 4 to 7

The oxygen and carbon contents in the porous silicon composite clusters of Preparation Examples 3 and 4 to 7 were evaluated in the same manner as applied to Preparation Example 1. The results are shown in Table 4.

TABLE 4

| Example | Oxygen (atom %) | Carbon (atom %) |
|---|---|---|
| Preparation Example 3 | 3.67 | 30.0 |
| Preparation Example 4 | 5.81 | 23.0 |
| Preparation Example 5 | 5.21 | 29.0 |
| Preparation Example 6 | 5.18 | 34.0 |
| Preparation Example 7 | 8.81 | 26.0 |

Referring to Table 4, the porous silicon composite clusters of Preparation Examples 4 to 7 had increased oxygen contents as compared with the oxygen content of the porous silicon composite cluster of Preparation Example 3. When the porous silicon composite clusters having the increased oxygen content were used, the coin cells tended to have reduced initial efficiency and capacity characteristics.

Evaluation Example 3

Raman Analysis

1) Preparation Examples 1 to 3

The porous silicon composite clusters of Preparation Examples 1 to 3 were analyzed by Raman spectroscopic analysis using a Raman 2010 Spectra (NT-MDT Development Co., Laser system: 473 nm, 633 nm, and 785 nm, Lowest Raman shift: ~50 wavenumbers (cm$^{-1}$), and spatial resolution: about 500 nm).

Raman spectra of graphene exhibit peaks at 1350 cm$^{-1}$, 1580 cm$^{-1}$, and 2700 cm$^{-1}$, providing information about a thickness, crystallinity, and a charge doping state. The peak at 1580 cm$^{-1}$ is a peak referred to as "G-mode" which is generated from a vibration mode, i.e., stretching of carbon-carbon bonds, and an energy of the G-mode is determined by a density of excess charges doped by graphene. The peak at 2700 cm$^{-1}$ is a peak referred to as "2D-mode," which is useful in evaluating a thickness of the graphene. The peak at 1350 cm$^{-1}$ is a peak referred to as "D-mode," which appears when there is a defect in a sp$^2$ crystalline structure. A D/G intensity region provides information about disordering of crystals of the graphene.

The intensity ratios of peak D to peak G (D/G intensity ratio) of the porous silicon composite clusters of Preparation Examples 1 to 3 were analyzed based on the results of the Raman analysis. The results are shown in Table 5.

TABLE 5

| Example | D/G intensity ratio |
| --- | --- |
| Preparation Example 1 | 1.25 |
| Preparation Example 2 | 1.21 |
| Preparation Example 3 | 1.10 |

Referring to Table 5, the porous silicon composite clusters of Preparation Examples 1 to 3 had a reduced D/G intensity ratio with an increasing duration of the chemical vapor deposition (CVD), due to improved quality of graphene serving as a protective layer.

2) Preparation Examples 4 to 7

The porous silicon composite clusters of Preparation Examples 4 to 7 were analyzed by Raman spectroscopy. The results of the Raman analysis are shown in Table 6.

TABLE 6

| Example | D/G intensity ratio |
| --- | --- |
| Preparation Example 4 | 1.22 |
| Preparation Example 5 | 1.11 |
| Preparation Example 6 | 1.06 |
| Preparation Example 7 | 1.23 |

3) Preparation Example 3

Figure 11:
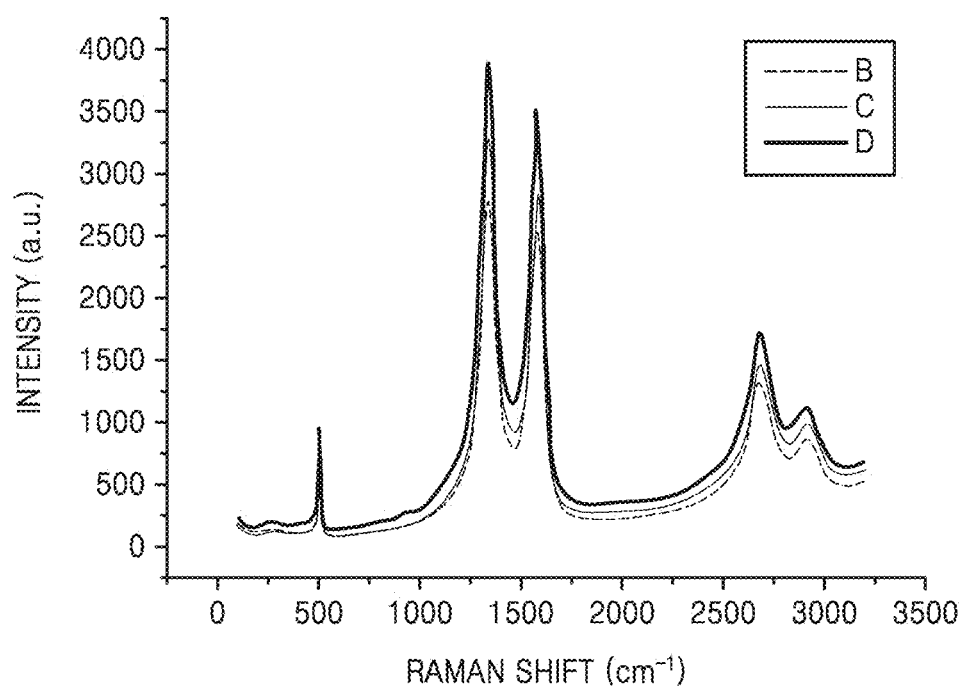
FIG. 11 is a graph of intensity (arbitrary units, a.u.) versus Raman shift (inverse centimeters, $cm^{-1}$) and illustrates the overlayed results of Raman spectroscopic analysis of the porous silicon composite cluster prepared according to Preparation Example 3.

Porous silicon composite clusters were repeatedly prepared according to Preparation Example 3, and analyzed by Raman spectroscopy. The results of the Raman analyses are shown in FIG. 11 and Table 7. In FIGS. 11, B, C, and D are experimentally repeated three times

TABLE 7

| Example | Sample | D/G intensity ratio |
| --- | --- | --- |
| Preparation Example 3 | B | 1.05 |
| | C | 1.15 |
| | D | 1.09 |

Referring to FIG. 11 and Table 7, the porous silicon composite cluster of Preparation Example 3 was found to contain highly crystalline graphene and have a D/G intensity ratio of about 1.10±0.05.

Evaluation Example 4

Transmission Electron Microscopy (TEM)

1) Preparation Examples 1 to 3 and Comparative Preparation Examples 1 to 3

The porous silicon composite clusters of Preparation Examples 1 to 3, the porous silicon primary particle of Comparative Preparation Example 1, the silicon composite primary particle of Comparative Preparation Example 2, and the silicon composite of Comparative Preparation Example 3 were analyzed by transmission electron microscopy (TEM) using a Titan cubed G2 60-300 (FEI). The resulting TEM images are shown in FIGS. 3A, 3B, 3C, 3D, 3E, 3F, 3G, 3H, 3I, 4A, 4B, 4C, 4D, 5A, 5B, 14A, 14B, and 14C.

Figure 3A:
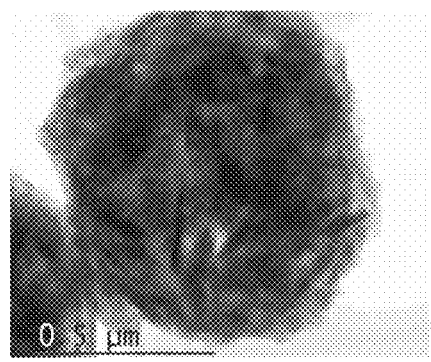
FIGS. 3A, 3B, and 3C are transmission electron microscope (TEM) images of the porous silicon composite cluster prepared according to Preparation Example 1, showing the overall shape and outer and inner regions of the cluster.
Figure 3B:
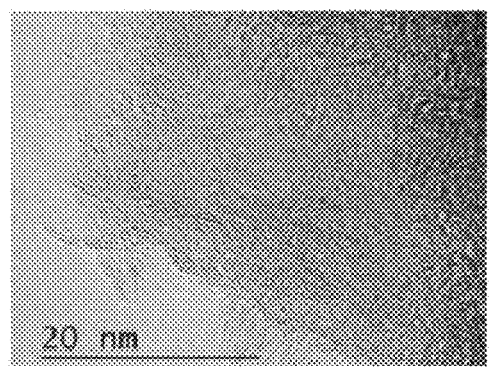
Figure 3C:
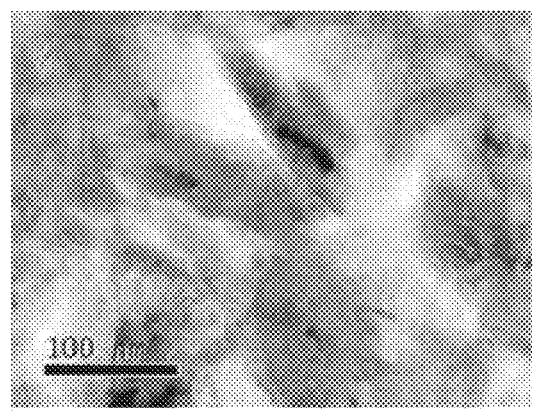
Figure 3D:
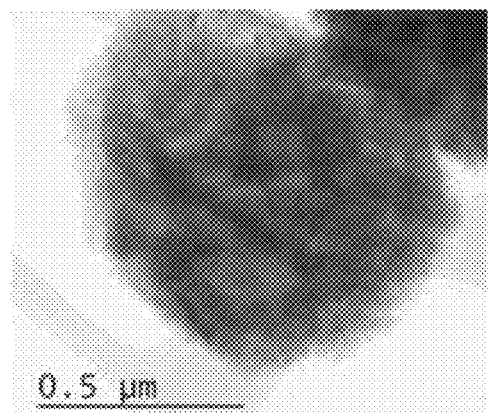
FIGS. 3D, 3E, and 3F are TEM images of the porous silicon composite cluster prepared according to Preparation Example 2, showing the overall shape and outer and inner regions of the cluster.
Figure 3E:
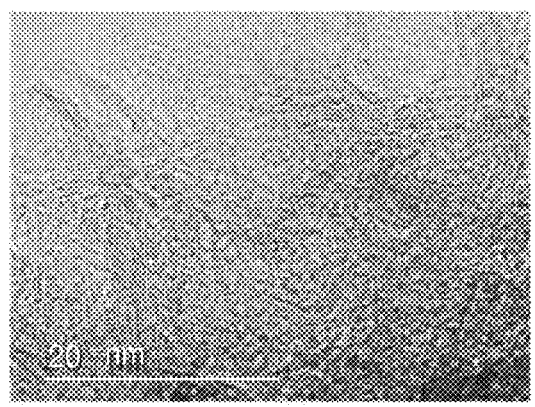
Figure 3F:
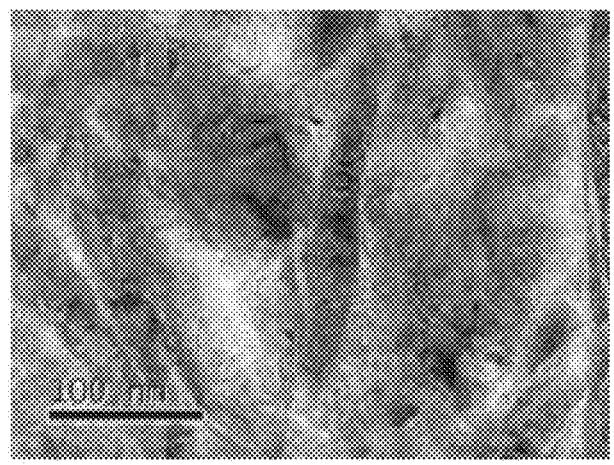
Figure 3G:
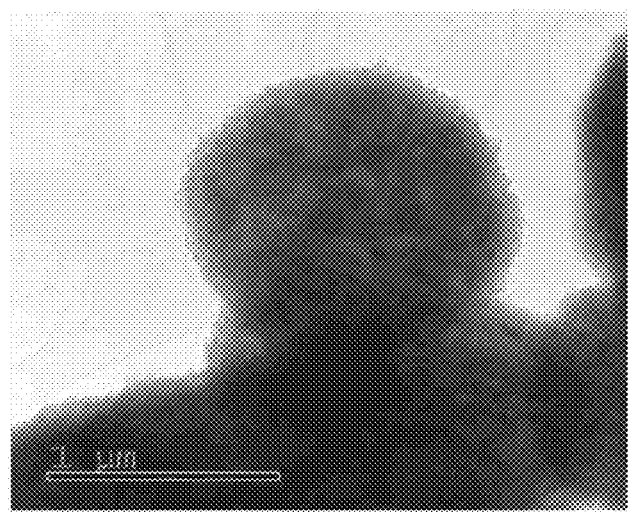
FIGS. 3G to 3I, 14A to 14C are TEM images of the porous silicon composite cluster of Preparation Example 2, showing the overall shape and outer and inner regions of the cluster.
Figure 3H:
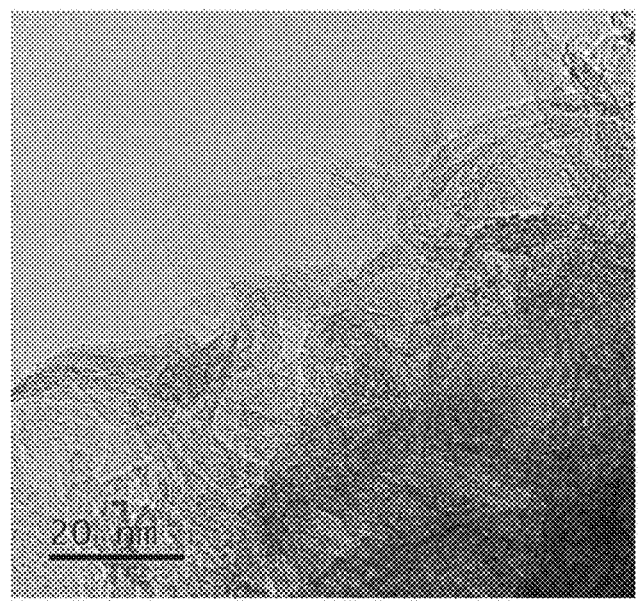
Figure 3I:
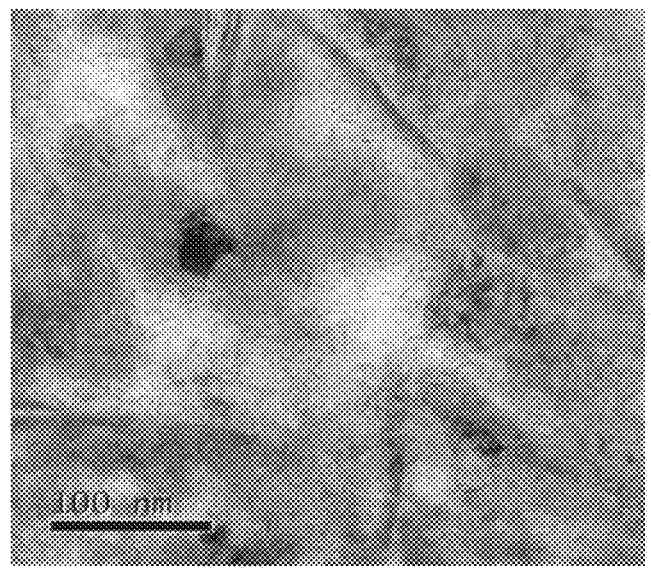

FIGS. 3A, 3B, and 3C are TEM images of the porous silicon composite cluster of Preparation Example 1, showing the overall shape and outer and inner regions of the cluster. FIGS. 3D, 3E, and 3F are TEM images of the porous silicon composite cluster of Preparation Example 2, showing the overall shape and outer and inner regions of the cluster. FIGS. 3G to 3I, 14A to 14C are TEM images of the porous silicon composite cluster of Preparation Example 3, showing the overall shape and outer and inner regions of the cluster.

Figure 4A:
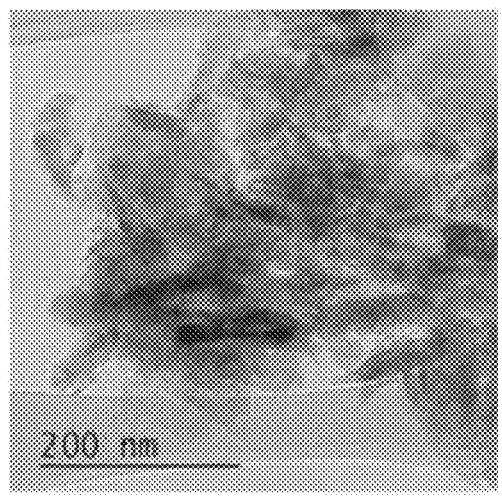
FIGS. 4A and 4B are each TEM images of the inner regions and outer regions, respectively, of the porous silicon primary particles prepared according to Comparative Preparation Example 1.
Figure 4B:
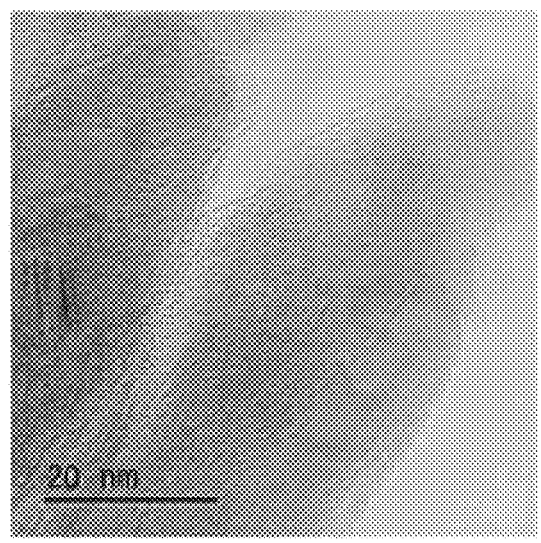
Figure 4C:
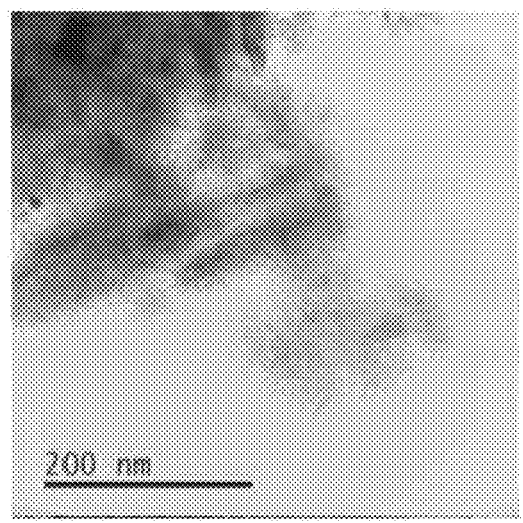
FIGS. 4C and 4D are each TEM images of the inner regions and outer regions, respectively, of the silicon composite primary particle prepared according to Comparative Preparation Example 2.
Figure 4D:
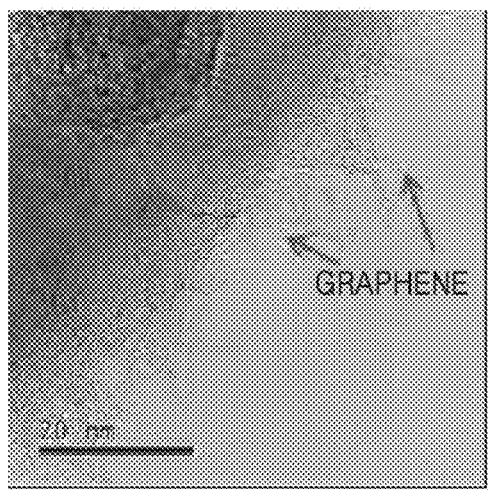

FIGS. 4A and 4C are TEM images of the inner regions of the porous silicon composite primary particles of Comparative Preparation Examples 1 and 2, respectively, and FIGS. 4B and 4D are TEM images of the outer regions of the porous silicon primary particle of Comparative Preparation Example 1, and the silicon composite primary particle of Comparative Preparation Example 2, respectively. Referring to FIG. 4D, the silicon composite primary particle of Comparative Preparation Example 2 was found to include graphene in the outer region.

Figure 5A:
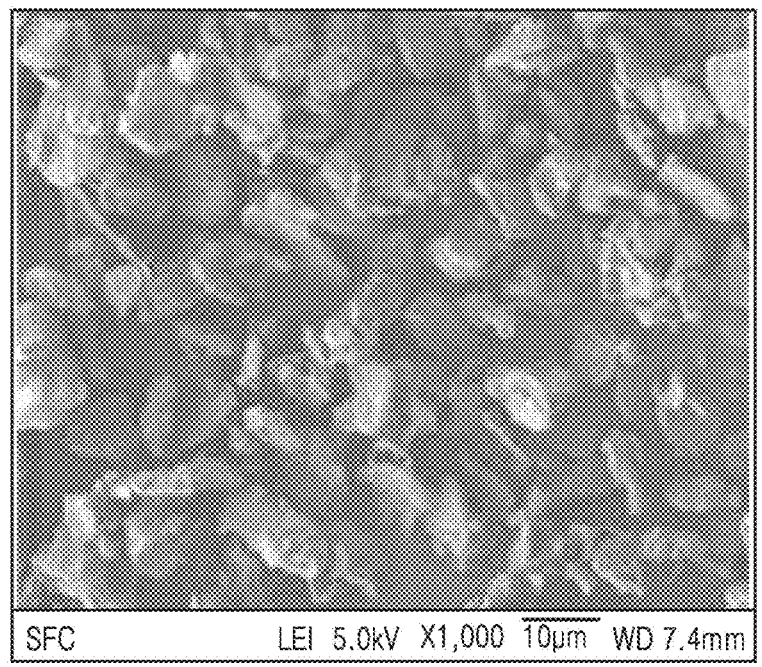
FIGS. 5A and 5B are scanning electron microscope (SEM) images of the silicon composite prepared according to Comparative Preparation Example 3.
Figure 5B:
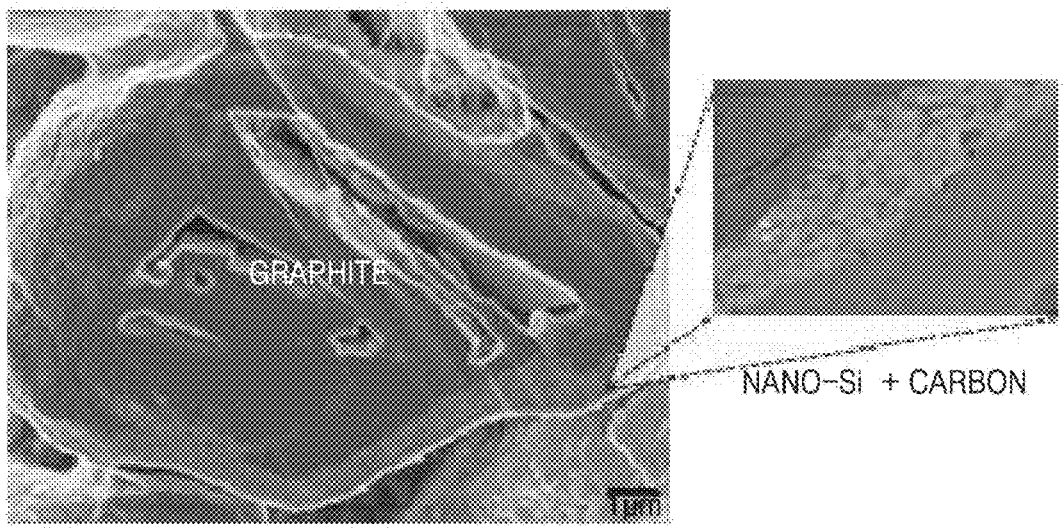

FIGS. 5A and 5B are TEM images of the silicon composite of Comparative Preparation Example 3.

The number of graphene layers in each of the inner and outer regions of the porous silicon composite clusters of Preparation Examples 1 to 3 were counted. The results are shown in Table 8.

TABLE 8

| Example | Number of outer graphene layers (n) | Number of inner graphene layers (n) |
| --- | --- | --- |
| Preparation Example 1 | <3 layers | — |
| Preparation Example 2 | 3 to 7 layers | 3 to 7 layers |
| Preparation Example 3 | 10 to 20 layers | 3 to 7 layers |

Referring to Table 8, the porous silicon composite clusters of Preparation Examples 1, 2, and 3 were found to have an increased number of graphene layers in the outer regions, formed after the formation of graphene layers in the inner regions, as the duration of CVD increased.

Although the presence of the number of internal graphene layers could be confirmed by performing Preparation Example 1, it was difficult to confirm the number of layers.

Referring to FIGS. 3A, 3B, 3C, 3D, 3E, 3F, 3G, 3H, 3I, 4A, 4B, 4C, 4D, 5A, 5B, 14A, 14B, and 14C, the porous silicon composite clusters of Preparation Examples 1 to 3 were found to have a larger number of graphene layers in the outer regions and a higher density, as compared with those of the porous silicon primary particle of Comparative Preparation Example 1 and the silicon composite primary particle of Comparative Preparation Example 2. The porous silicon composite clusters of Preparation Examples 1 to 3 were found to have a higher density of graphene with an increasing duration of CVD.

2) Preparation Examples 1 to 3 and Comparative Preparation Example 4

The porous silicon composite clusters of Preparation Examples 1 to 3 and the porous silicon secondary particles of Comparative Preparation Example 4 were analyzed by TEM using a Titan cubed G2 60-300 (FEI). The resulting TEM images are shown in FIGS. 6A, 6B, 6C, 7A, 7B, 7C, 8A, 8B, 8C, 9A, 9B, and 9C.

Figure 6A:
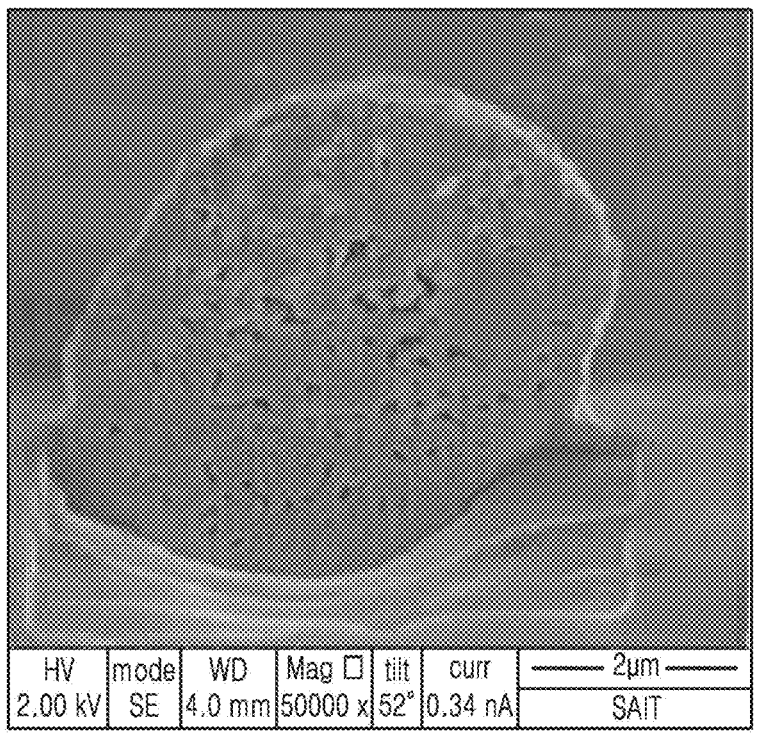
FIGS. 6A, 6B, and 6C are SEM images of the porous silicon composite cluster prepared according to Preparation Example 1.
Figure 6B:
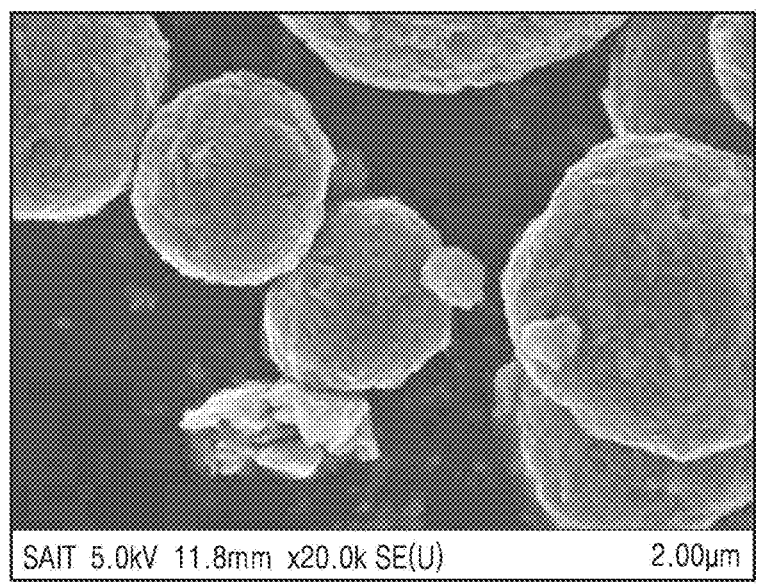
Figure 6C:
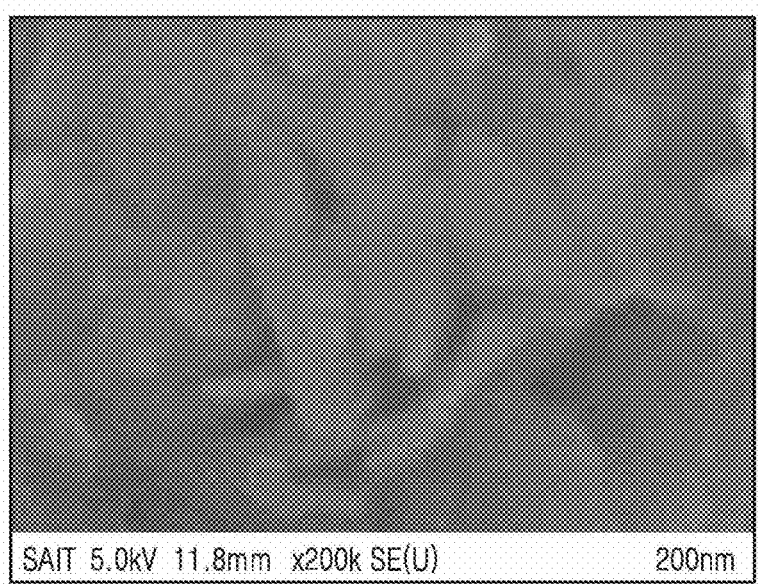
Figure 7A:
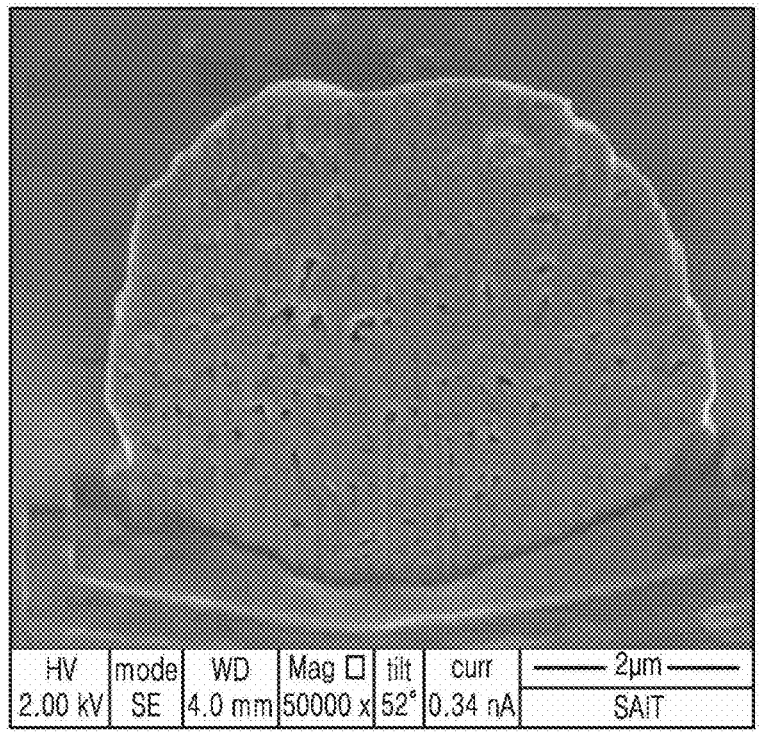
FIGS. 7A, 7B, and 7C are SEM images of the porous silicon composite cluster prepared according to Preparation Example 2.
Figure 7B:
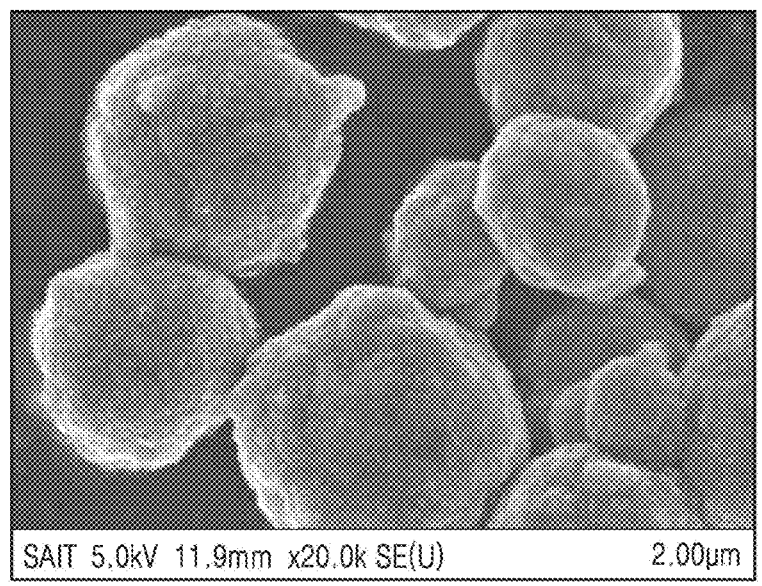
Figure 7C:
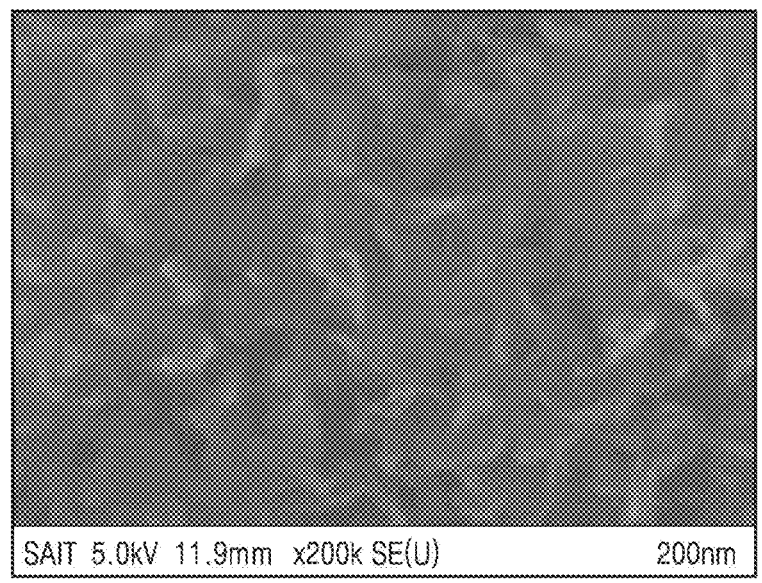
Figure 8A:
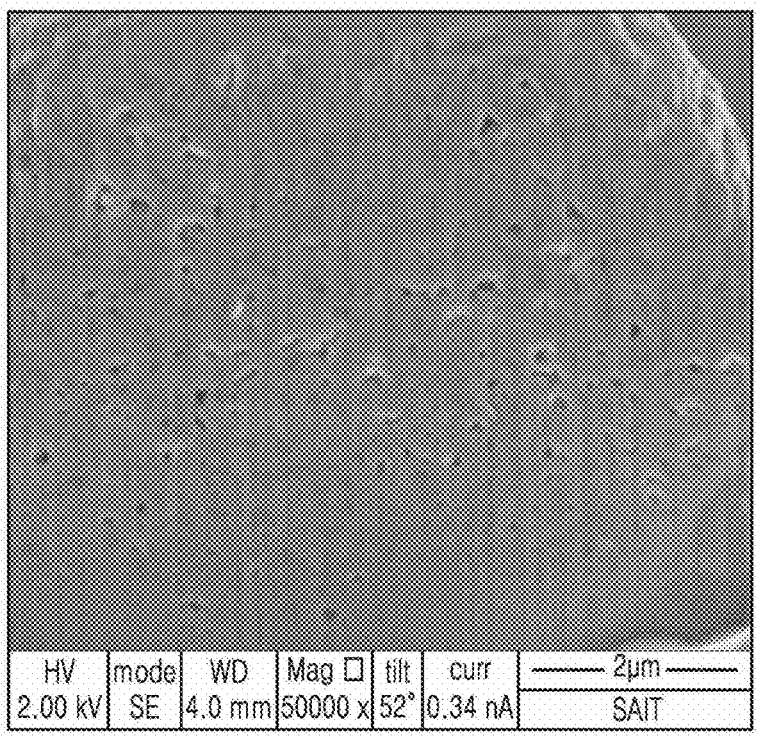
FIGS. 8A, 8B, and 8C are SEM images of the porous silicon composite cluster prepared according to Preparation Example 3.
Figure 8B:
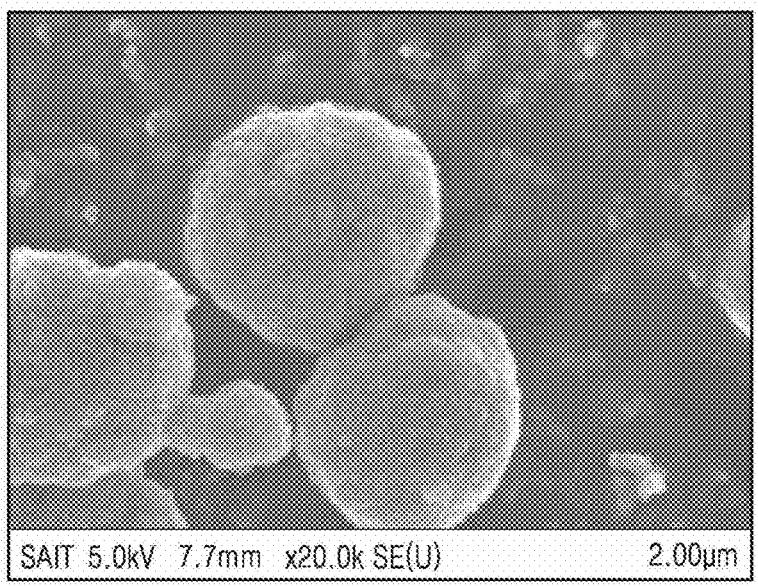
Figure 8C:
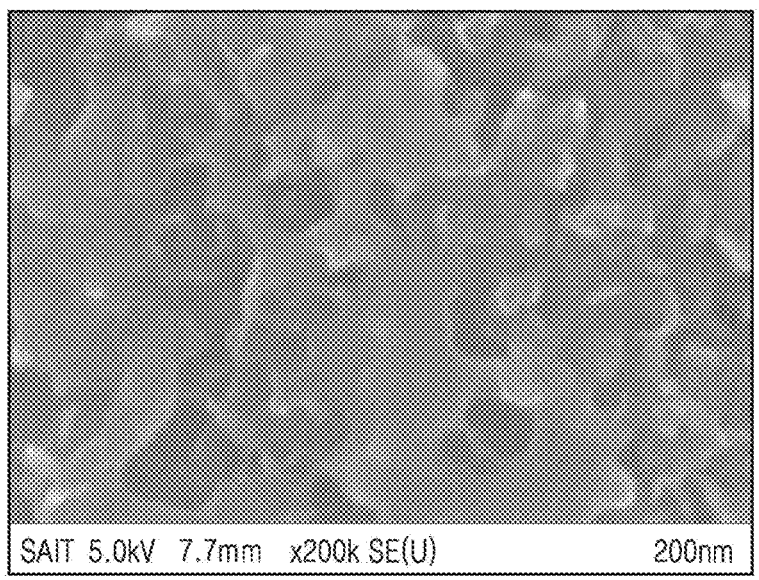
Figure 9A:
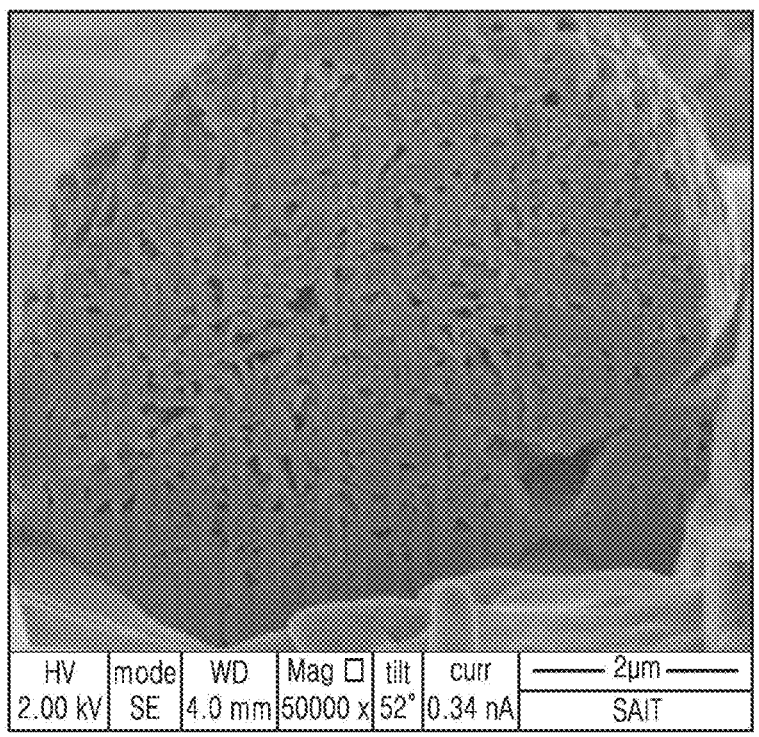
FIGS. 9A, 9B, and 9C are SEM images of the porous silicon secondary particles prepared according to Comparative Preparation Example 4.
Figure 9B:
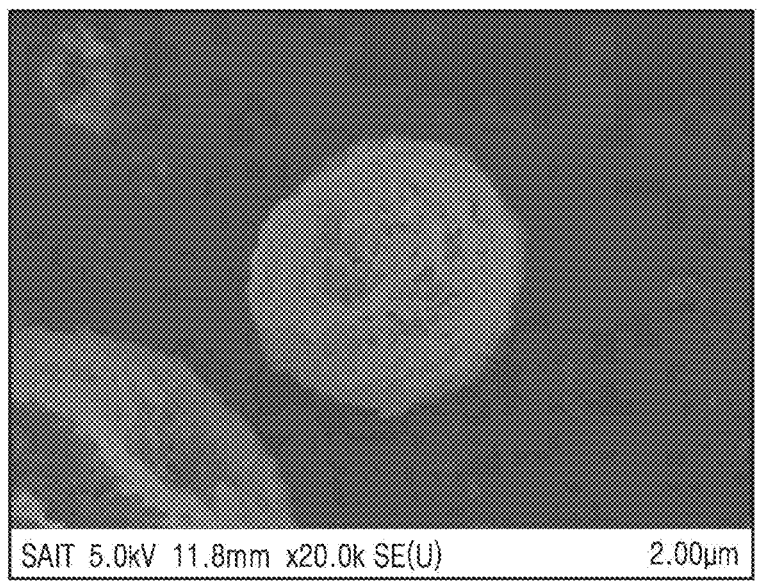
Figure 9C:
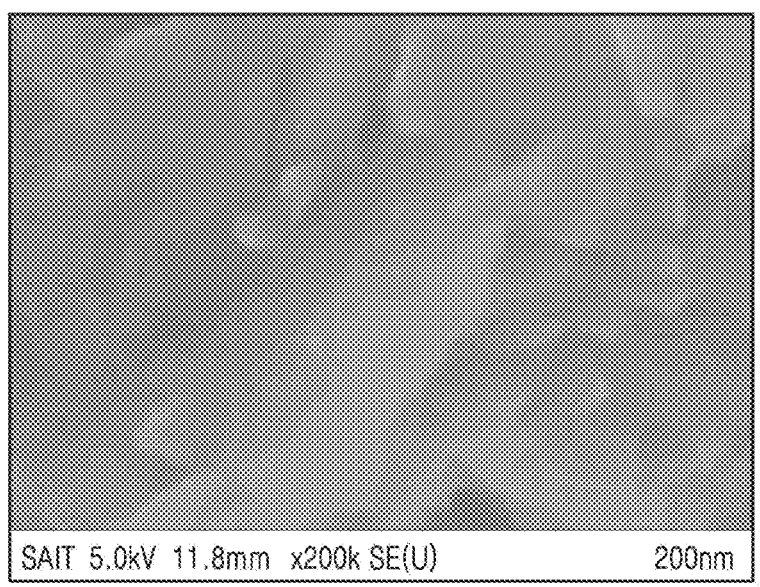

FIGS. 6A, 6B, and 6C are each TEM images of the porous silicon composite cluster of Preparation Example 1. FIGS. 7A, 7B, and 7C are each TEM images of the porous silicon composite cluster of Preparation Example 2. FIGS. 8A, 8B, and 8C are each TEM images of the porous silicon composite cluster of Preparation Example 3. FIGS. 9A, 9B, and 9C are each TEM images of the porous silicon secondary particles of Comparative Preparation Example 4.

Referring to FIGS. 6A, 6B, 6C, 7A, 7B, 7C, 8A, 8B, 8C, 9A, 9B, and 9C, the porous silicon composite clusters of Preparation Examples 1 to 3 were found to have a higher density of graphene with an increasing duration of CVD, due to further growth of graphene, as compared to the porous silicon secondary particles of Comparative Preparation Example 4.

3) Preparation Example 3

Figure 10A:
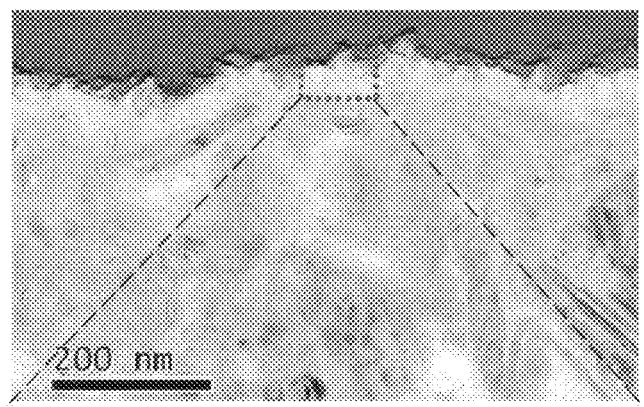
FIG. 10A is a TEM image of the porous silicon composite cluster prepared according to Preparation Example 3.
Figure 10B:
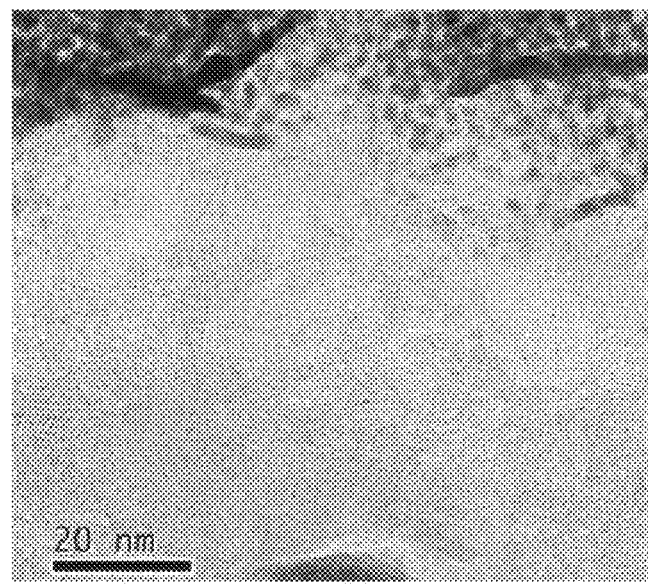
FIG. 10B is a magnified TEM image of a region denoted by a dotted square in FIG. 10A.

The porous silicon composite cluster of Preparation Example 3 was analyzed by TEM. The results are shown in FIGS. 10A and 10B. FIG. 10B is a magnified image of a region denoted by a dotted square in FIG. 10A.

Referring to FIGS. 10A and 10B, the porous silicon composite cluster of Preparation Example 3 was found to have graphene layers having a thickness of about 20 nm to about 60 nm, serving as a protective layer, in the outer region.

Evaluation Example 5

Thickness Expansion

The coin cells prepared according to Examples 8-10 and Comparative Examples 5-8 were charged at a constant current (CC) of 0.1 C to 5 mV and then reached a current of 0.005 C. Thereafter, the coin cells were allowed to stand for 20 minutes, and then discharged at a constant current of 0.1 C to 1.5V to perform a first cycle charge/discharge. Thereafter, the coin cells were allowed to stand for 20 minutes, and then the electrode was fully charged at 0.2C and the coin cell was disassembled to determine the thickness difference. The thickness expansion of the electrode was measured. The measurement results are shown in Table 9 below.

TABLE 9

| Example | Thickness expansion (%)† |
|---|---|
| Example 8 | 30-32 |
| Example 9 | 28-30 |
| Example 10 | 23-25 |
| Comparative Example 5 | 65 |
| Comparative Example 6 | 42 |
| Comparative Example 7 | 83 |
| Comparative Example 8 | 45 |

†Thickness expansion = [(thickness of electrode after charge/discharge cycle-thickness of electrode before charge/discharge cycle)/thickness of electrode before charge discharge cycle] × 100%

Referring to Table 9, the coin cells of Examples 8 to 10 were found to have a smaller electrode thickness expansion as compared with the coin cells of Comparative Examples 5 to 8.

Evaluation Example 6

Scanning Electron Microscopy (SEM) After Charging and Discharging

Charging and discharging characteristics of the coin cell of Example 3 were evaluated in the following manner.

Figure 12A:
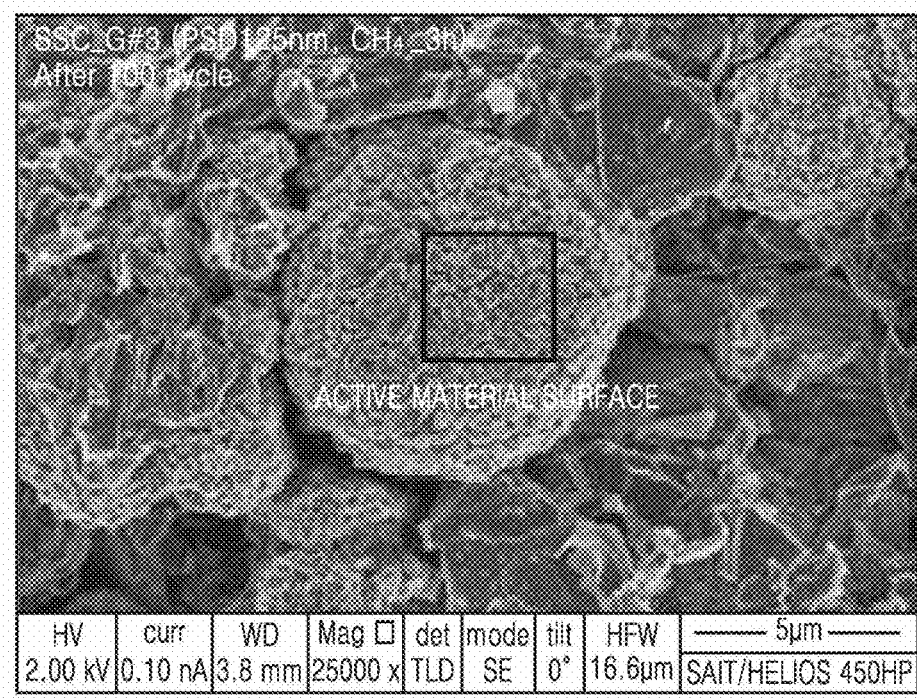
FIG. 12A is a scanning electron microscope (SEM) image of a surface of a negative active material used in a negative electrode of a coin cell prepared according to Example 3 after charging and discharging.
Figure 12B:
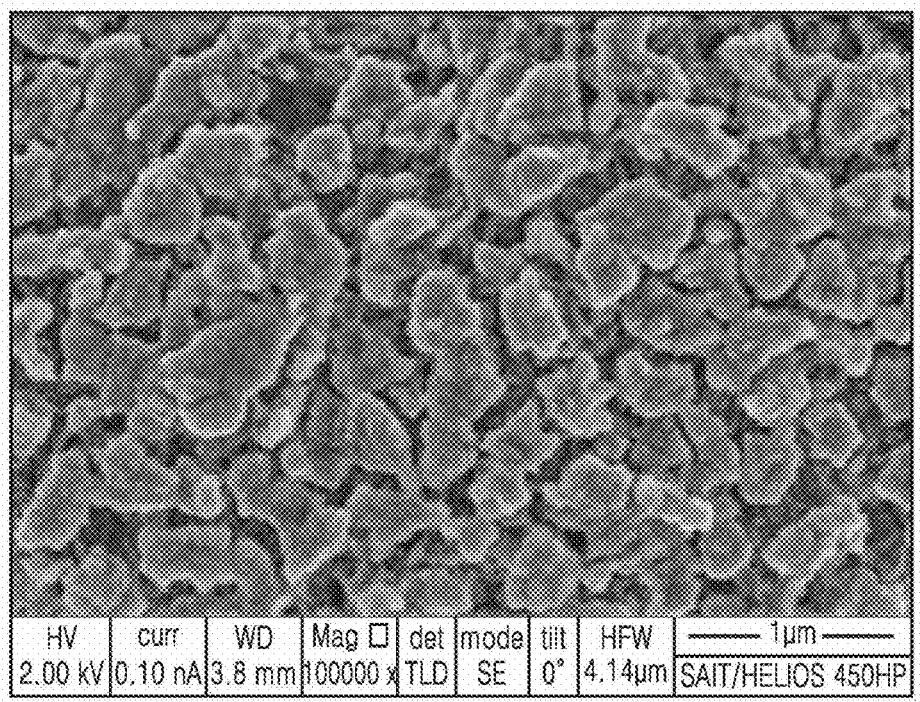
FIG. 12B is an SEM image of the boxed region of FIG. 12A.
Figure 12C:
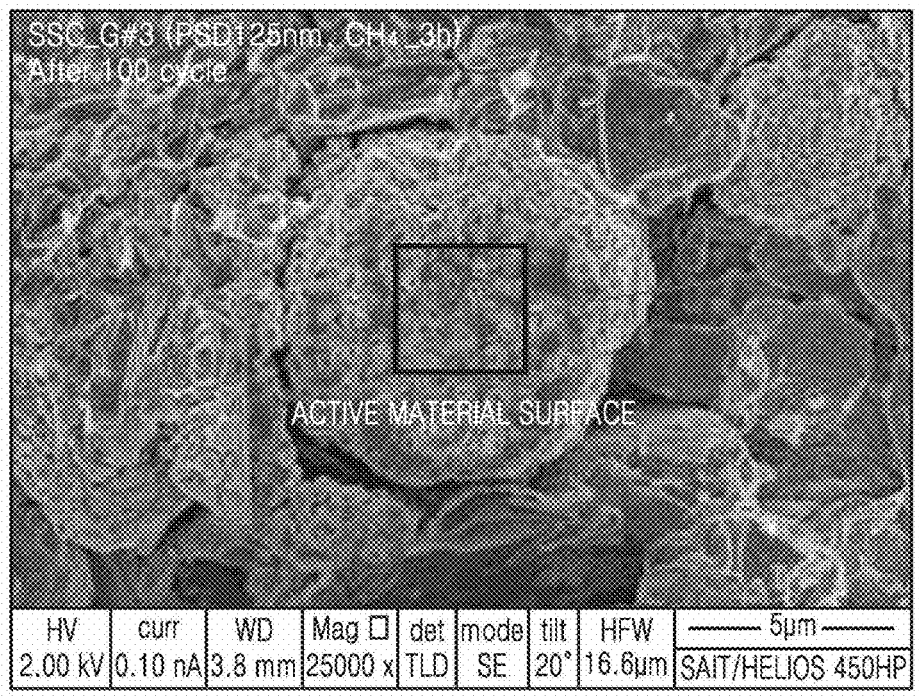
FIG. 12C is an SEM image of a cross-section of the negative active material used in the negative electrode of the coin cell prepared according to Example 3 after charging and discharging.
Figure 12D:
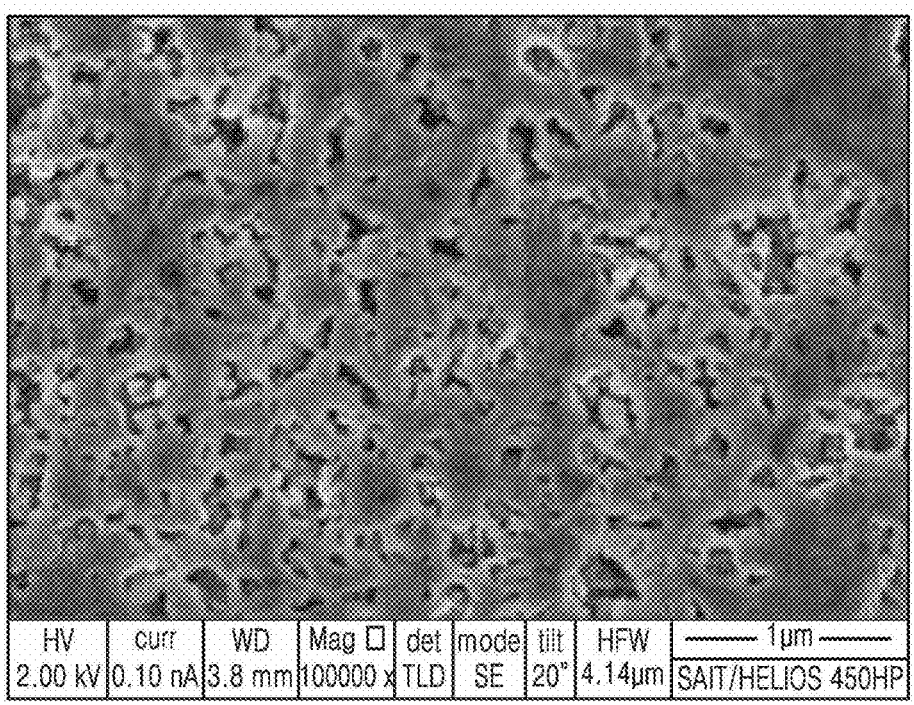
FIG. 12D is an SEM image of the boxed region of FIG. 12C.
Figure 12E:
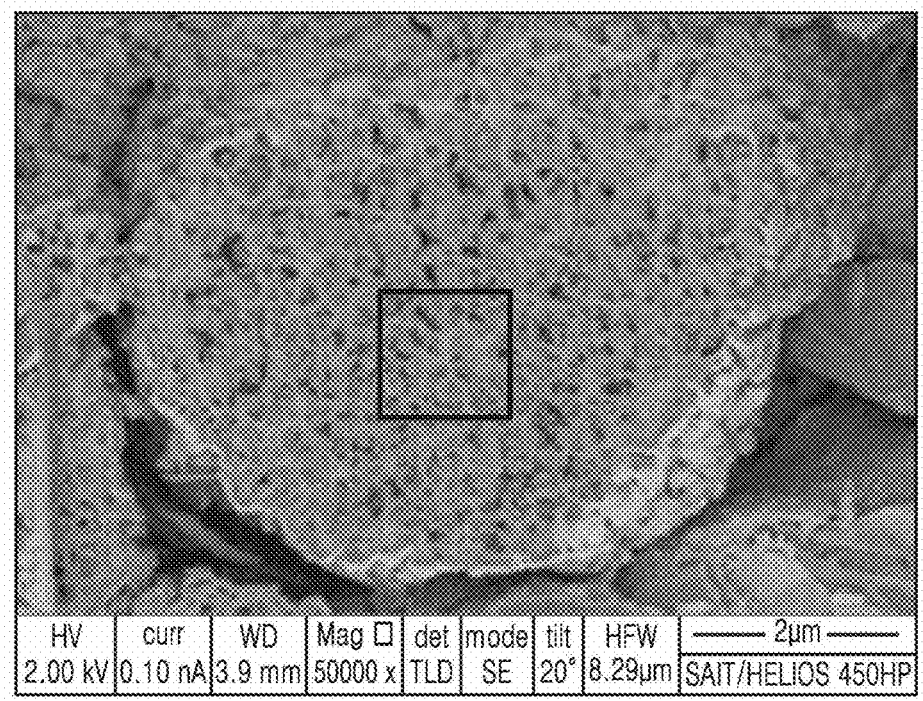
FIG. 12E is an SEM image of a cross-section of the negative active material used in the negative electrode of the coin cell prepared according to Example 3 after charging and discharging.

Charging and discharging conditions were as described in Evaluation Example 1. After the 100$^{th}$ charging and discharging cycle, a surface and a cross-section of a negative active material of the negative electrode was observed using scanning electron microscopy (SEM). The surface analysis results of the negative active material are shown in FIGS. 12A and 12B, and the cross-sectional analysis results of the negative active material are shown in FIGS. 12C, 12D, and 12E.

Referring to FIGS. 12A, 12B, 12C, 12D, and 12E, the coin cell of Example 3 was found to have maintained a secondary particle structure after the 100$^{th}$ cycle of charging and discharging. Accordingly, a battery having a low expansion ratio and improved durability may be manufactured using a structurally stable negative active material such as that used in the coin cell of Example 3, which remains stable even after the repeated cycles of charging and discharging.

Evaluation Example 7

Scanning Electron Microscopy (SEM)

The porous silicon composite cluster of Preparation Example 3 was analyzed using SEM. The results are shown in FIGS. 13A, 13B, 13C, and 13D.

Figure 13A:
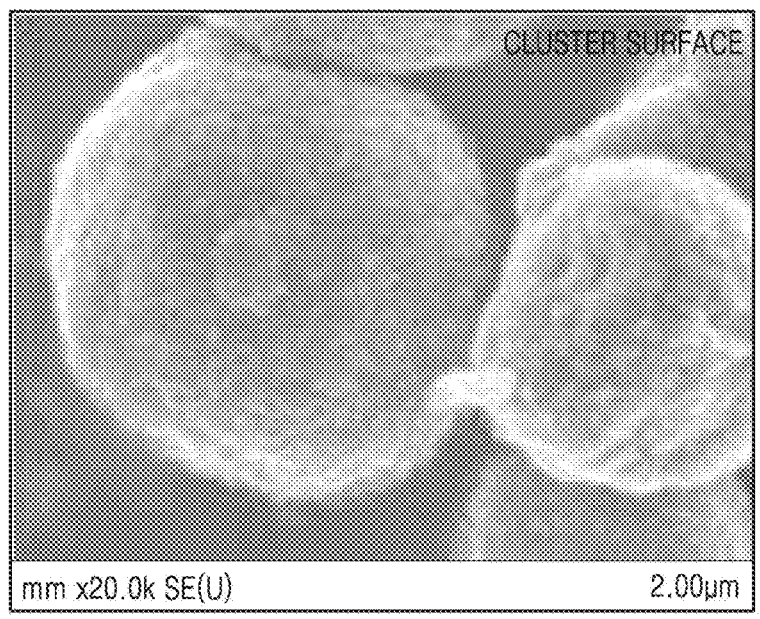
FIG. 13A is an SEM image of a surface of the porous silicon composite cluster prepared according to Preparation Example 3.
Figure 13B:
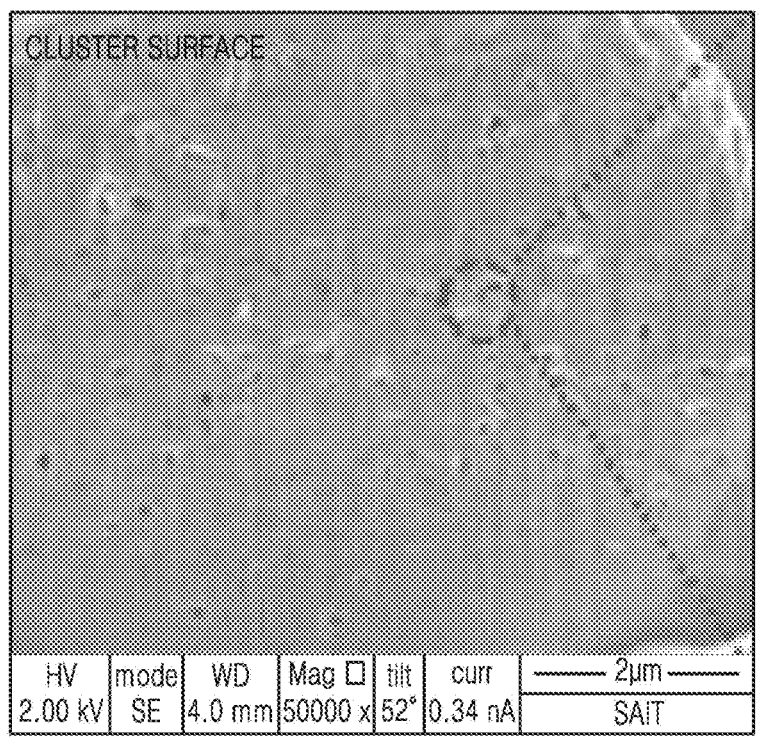
FIG. 13B is an SEM image of a cross-section of the porous silicon composite cluster prepared according to Preparation Example 3.
Figure 13C:
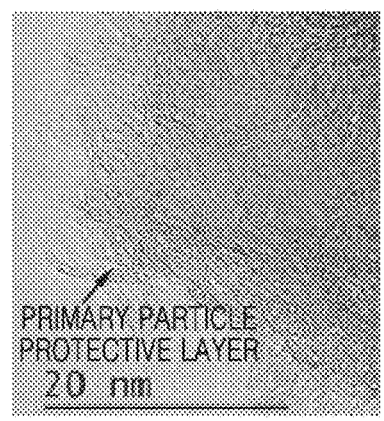
FIG. 13C is a high-magnification SEM image of a region denoted by a circle in the cross-sectional SEM image of FIG. 13B.
Figure 13D:
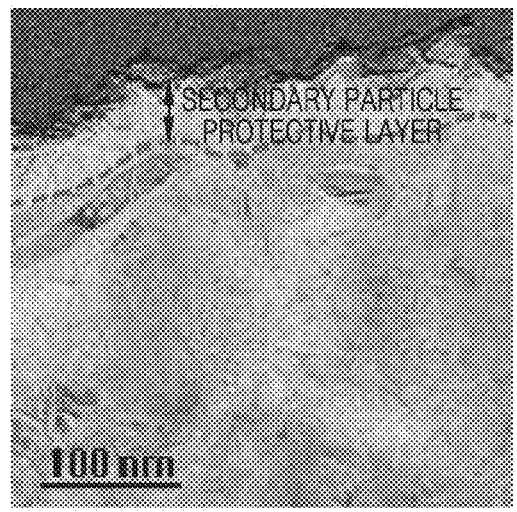
FIG. 13D is a high-magnification SEM image of the region denoted by a circle in the SEM image of FIG. 13B.
Figure 14A:
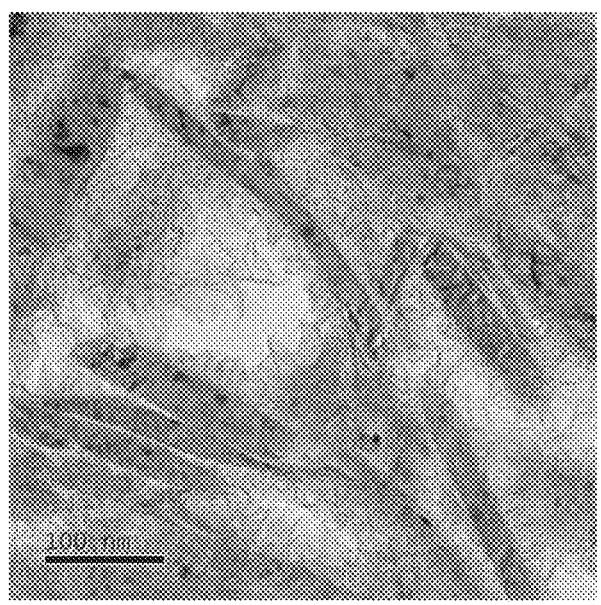
Figure 14B:
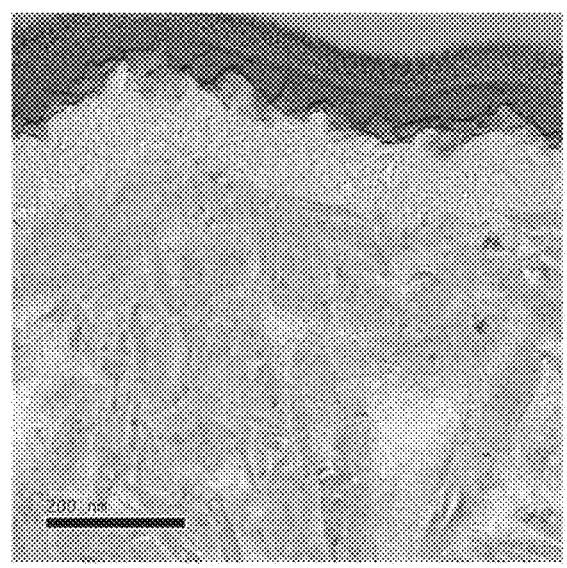
Figure 14C:
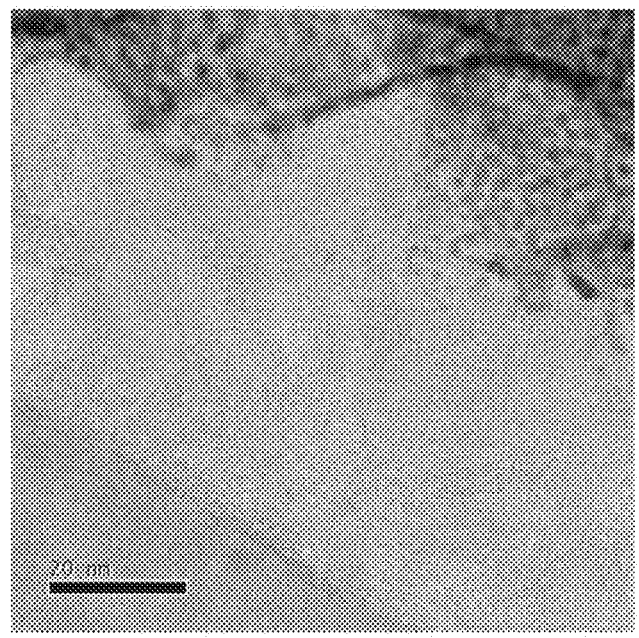

FIG. 13A is an SEM image of a surface of the porous silicon composite cluster of Preparation Example 3. FIG. 13B is an SEM image of a cross-section of the porous silicon composite cluster of Preparation Example 3. FIG. 13C is a high-magnification SEM image of a region denoted by a circle in the cross-sectional SEM image of FIG. 13B, which illustrates a graphene protective layer on the silicon composite primary particles. FIG. 13D is a high-magnification SEM image of the region denoted by a circle in the SEM image of FIG. 13B, which illustrates a secondary particle protective layer in the outer region near the silicon surface.

Referring to FIGS. 13A, 13B, 13C, and 13D, the porous silicon composite cluster of Preparation Example 3 was found to have a primary particle protective layer having a thickness of about 20 nm.

Evaluation Example 8

Analysis of Particle Size (D50), Specific Surface Area (BET), Powder Density, and the Number of Graphene Layers in Porous Silicon Composite Cluster Particle size, Brunauer-Emmett-Teller (BET) specific surface area, powder density, and the number of graphene layers in the porous silicon composite clusters of Preparation Examples 1 to 3, the porous silicon primary particle of Comparative Preparation Example 1, the silicon composite primary particle of Comparative Preparation Example 2, the silicon composite of Comparative Preparation Example 3, and the porous silicon secondary particle of Comparative Preparation Example 4 were analyzed. The results are shown in Table 10.

The particle sizes were measured by particle size analysis (PSA) using SEM. A powder density refers to a density of a powder sample before being pressed. The number of graphene layers was analyzed using TEM. The BET specific surface areas were measured using a nitrogen adsorption and desorption apparatus (i.e., a QUADRASORB SI adsorption apparatus manufactured by Quantachrome Instruments, Florida), and the BET specific surface areas were calculated by using a BET method within a relative range of nitrogen pressure ($P/P_0$) that is between about 0 to about 1.0 ($P/P_0$).

TABLE 10

| Example | Particle size (D50) (μm) | BET specific surface area (m$^2$/g) | Powder density (g/cc) | Number of graphene layers (n) |
|---|---|---|---|---|
| Preparation Example 1 | 4.2 | 35.0 | 1.0 | ~3 |
| Preparation Example 2 | 4.4 | 9.3 | 1.1 | ~7 |
| Preparation Example 3 | 4.8 | 6.3 | 1.1 | 7-20 |

TABLE 10-continued

| Example | Particle size (D50) (μm) | BET specific surface area (m²/g) | Powder density (g/cc) | Number of graphene layers (n) |
|---|---|---|---|---|
| Comparative Preparation Example 1 | <1.2 | 153.5 | 0.3 | — |
| Comparative Preparation Example 2 | — | 85.0 | 0.52 | 1.2 |
| Comparative Preparation Example 3 | 9.0 | 3~10 | 0.98 | — |
| Comparative Preparation Example 4 | 3.8 | 102.5 | 09.9 | — |

Referring to Table 10, the porous silicon composite clusters of Preparation Examples 1 to 4 were found to have an increased powder density, as compared with the porous silicon primary particle of Comparative Preparation Example 1, the silicon composite primary particle of Comparative Preparation Example 2, the silicon composite of Comparative Preparation Example 3, and porous silicon secondary particle of Comparative Preparation Example 4, and thus may be used to prepare a negative active material having an improved volume energy density. The porous silicon composite clusters of Preparation Examples 1 to 4 were also found to have a reduced BET specific surface area and thus improved initial efficiency and durability characteristics, as compared with the porous silicon composite primary particles of Comparative Preparation Examples 1, 2, and 4.

As described above, according to an embodiment, when used as an electrode active material, a porous silicon composite cluster may form a network between silicon particles to thus suppress expansion of the electrode plate during charging and discharging, and may improve the initial efficiency and volume energy density of the lithium battery. The porous silicon composite cluster may also form a conductive, durable protective layer for silicon, and thus may improve durability of the lithium battery against charging and discharging.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A porous silicon composite cluster comprising:
a porous core comprising a porous silicon composite secondary particle, wherein the silicon composite secondary particle comprises an aggregate of two or more silicon composite primary particles, and the silicon composite primary particles each comprise silicon, a silicon oxide of the Formula $SiO_x$, wherein $0<x<2$, disposed on the silicon, and a first graphene disposed on the silicon oxide; and
a shell disposed on and surrounding the core, the shell comprising a second graphene.

2. The porous silicon composite cluster of claim 1, wherein the first graphene of the core has a same or different number of layers than the second graphene of the shell, and the second graphene of the shell has a greater density than a density of the first graphene of the core.

3. The porous silicon composite cluster of claim 1, wherein the porous silicon composite cluster has a double core/shell structure.

4. The porous silicon composite cluster of claim 3, wherein the first graphene of the silicon composite primary particle is on a surface of the silicon oxide.

5. The porous silicon composite cluster of claim 1, further comprising an outer layer disposed on the shell, and having a greater density than the core.

6. The porous silicon composite cluster of claim 1, wherein a ratio of a diameter of the core to a thickness of the shell of the porous silicon composite cluster is from about 1:0.001 to about 1:1.67.

7. The porous silicon composite cluster of claim 1, wherein a total amount of the first graphene and the second graphene in the porous silicon composite cluster is about 0.1 parts to about 2,000 parts by weight, based on 100 parts by weight of the silicon.

8. The porous silicon composite cluster of claim 1, wherein the first graphene of the silicon composite primary particles
extends from the silicon oxide by a distance of about 10 nanometers or less,
comprises at least one to thirty graphene layers,
has a total thickness of about 0.3 nanometers to about 1,000 nanometers, and
is oriented at an angle of about 0° to about 90° with respect to a major axis of the silicon.

9. The porous silicon composite cluster of claim 1, wherein the second graphene extends from the silicon oxide by a distance of about 1000 nanometers or less, comprises at least one to thirty graphene layers, has a total thickness of about 0.6 nanometers to about 50 nanometers, and is oriented at an angle of about 0° to about 90° with respect to a major axis of the silicon.

10. The porous silicon composite cluster of claim 1, wherein the silicon oxide has a thickness of about 30 micrometers or less.

11. The porous silicon composite cluster of claim 1, wherein the silicon is in the form of a sphere, a nanowire, a needle, a rod, a particle, a nanotube, a nanorod, a wafer, a nanoribbon, plate- and needle-like, or a combination comprising at least one of the foregoing.

12. The porous silicon composite cluster of claim 1, wherein the porous silicon composite secondary particle has an average particle diameter of about 200 nanometers to about 50 micrometers, a specific surface area of about 0.1 square meters per gram to about 100 square meters per gram, and a density of about 0.1 gram per cubic centimeter to about 2.8 gram per cubic centimeter.

13. The porous silicon composite cluster of claim 1, wherein the silicon has an average particle diameter of about 10 nanometers to about 30 micrometers.

14. The porous silicon composite cluster of claim 1, wherein the porous silicon composite cluster has a D50 particle size of about 1 micrometers to about 30 micrometers, a D10 particle size of about 0.001 micrometers to about 10 micrometers, and a D90 particle size of about 10 micrometers to about 30 micrometers.

15. The porous silicon composite cluster of claim 1, wherein an amount of oxygen of the porous silicon composite cluster is about 0.01 atom percent to about 15 atom percent, based on the total atom percent of oxygen, carbon and silicon atoms in the porous silicon composite cluster.

16. A method of preparing the porous silicon composite cluster of claim 1, the method comprising:
contacting silicon having silicon oxide disposed on the silicon, a dispersing agent, and a solvent to form a composition comprising a porous silicon secondary particle; and
thermally treating the porous silicon secondary particle in an atmosphere comprising a carbon source gas to form the porous silicon composite cluster.

17. The method of claim 16, wherein the solvent is an alcohol solvent, and
further comprising spray-drying the composition to obtain the porous silicon secondary particle.

18. The method of claim 16, wherein the dispersing agent is stearic acid, resorcinol, polyvinyl alcohol, pitch, or a combination comprising at least one of the foregoing.

19. The method of claim 16, wherein the carbon source gas is a compound represented by Formula 1, a compound represented by Formula 2, a compound represented by Formula 2a, an oxygen-containing compound represented by Formula 3, or a combination comprising at least one of the foregoing:

$$C_nH_{(2n+2-a)}[OH]_a \qquad \text{Formula 1}$$

wherein, in Formula 1, n is an integer of 1 to 20, and a is 0 or 1, $$C_nH_{(2n)} \qquad \text{Formula 2}$$

wherein, in Formula 2, n is an integer of 2 to 6, $$C_nH_n \qquad \text{Formula 2a}$$

wherein, in Formula 2, n is an integer of 2 to 6, and $$C_xH_yO_z \qquad \text{Formula 3}$$

wherein, in Formula 3, x is an integer of 1 to 20, y is 0 or an integer of 1 to 20, and z is 1 or 2.

20. The method of claim 19, wherein the atmosphere further comprises a second oxygen-containing compound represented by Formula 3a:

$$C_xH_yO_z \qquad \text{Formula 3a}$$

wherein, in Formula 3, x is 0 or an integer of 1 to 20, y is 0 or an integer of 1 to 20, and z is 1 or 2, and the second oxygen-containing compound represented by Formula 3a is different from the oxygen-containing compound represented by Formula 3.

21. The method of claim 16, wherein the carbon source gas is methane, ethylene, propylene, methanol, ethanol, propanol, acetylene or a combination comprising at least one of the foregoing.

22. The method of claim 16, wherein the thermally treating is performed at a temperature of about 600° C. to about 1,100° C.

23. A carbon composite comprising the porous silicon composite cluster of claim 1 and a carbonaceous material.

24. The carbon composite of claim 23, wherein an amount of the carbonaceous material is about 0.001 parts to about 99 parts by weight, based on 100 parts by weight of the carbon composite.

25. The carbon composite of claim 24, wherein the carbonaceous material is graphene, graphite, fullerene, carbon fiber, carbon nanotube, or a combination comprising at least one of the foregoing.

26. An electrode comprising the porous silicon composite cluster of claim 1.

27. The electrode of claim 26, further comprising a carbonaceous material.

28. A lithium battery comprising the electrode of claim 26.

29. A field emission device comprising the porous silicon composite cluster of claim 1, or comprising the porous silicon composite cluster of claim 1 and a carbonaceous material.

30. A bio sensor comprising the porous silicon composite cluster of claim 1, or comprising the porous silicon composite cluster of claim 1 and a carbonaceous material.

31. A semiconductor device comprising the porous silicon composite cluster of claim 1, or comprising the porous silicon composite cluster of claim 1 and a carbonaceous material.

32. A thermoelectric device comprising the porous silicon composite cluster of claim 1, or comprising the porous silicon composite cluster of claim 1 and a carbonaceous material.

33. A porous silicon composite cluster comprising:
a porous core comprising a porous silicon composite secondary particle,
wherein the porous silicon composite secondary particle comprises an aggregate of two or more silicon composite primary particles, and the silicon composite primary particles each comprise at least one silicon oxide and a first graphene disposed on the at least one silicon oxide, wherein the at least one silicon oxide comprises a silicon oxide of the Formula $SiO_x$, wherein $0<x<2$, a thermal treatment product of a silicon oxide of the Formula $SiO_x$, wherein $0<x<2$, or a combination comprising at least one of the foregoing; and
a shell disposed on and surrounding the core, the shell comprising a second graphene.

34. The porous silicon composite cluster of claim 33, wherein the thermal treatment product of the silicon oxide of the Formula $SiO_x$, wherein $0<x<2$ is a product obtained by thermally treating the silicon oxide of the Formula $SiO_x$, wherein $0<x<2$, in an atmosphere of i) a carbon source gas or ii) a gas mixture comprising a carbon source gas and a reducing gas.

35. The porous silicon composite cluster of claim 33, wherein the thermal treatment product of the silicon oxide of the Formula $SiO_x$, wherein $0<x<2$ has a structure comprising silicon arranged in a matrix of a silicon oxide of the Formula $SiO_y$, wherein $0<y\leq2$.

36. The porous silicon composite cluster of claim 33, wherein the thermal treatment product of the silicon oxide of the Formula $SiO_x$, wherein $0<x<2$ has i) a structure comprising silicon arranged in a matrix of $SiO_2$, ii) a structure comprising silicon arranged in a matrix comprising $SiO_2$ and a silicon oxide of the Formula $SiO_y$, wherein $0<y<2$, or iii) a structure comprising silicon arranged in a matrix of a silicon oxide of the Formula $SiO_y$, wherein $0<y<2$.

37. The porous silicon composite cluster of claim 33, further comprising an amorphous carbon layer disposed between the at least one silicon oxide and the first graphene disposed on the at least one silicon oxide.

38. The porous silicon composite cluster of claim 33, further comprising an amorphous carbon layer disposed between the porous core comprising the porous silicon composite secondary particle, and the second graphene.

* * * * *